(12) United States Patent
Hyde et al.

(10) Patent No.: US 9,026,719 B2
(45) Date of Patent: May 5, 2015

(54) INTELLIGENT MONITORING FOR COMPUTATION IN MEMORY

(71) Applicant: Elwha LLC, Bellevue, WA (US)

(72) Inventors: Roderick A. Hyde, Redmond, WA (US); Nicholas F. Pasch, Bellevue, WA (US); Clarence T. Tegreene, Mercer Island, WA (US)

(73) Assignee: Elwha, LLC, Bellevue, WA (US)

( * ) Notice: Subject to any disclaimer, the term of this patent is extended or adjusted under 35 U.S.C. 154(b) by 222 days.

(21) Appl. No.: 13/678,430

(22) Filed: Nov. 15, 2012

(65) Prior Publication Data
US 2014/0136754 A1    May 15, 2014

(51) Int. Cl.
G06F 12/02    (2006.01)
G06F 11/34    (2006.01)
G11C 29/04    (2006.01)
G11C 29/44    (2006.01)
G06F 15/78    (2006.01)

(52) U.S. Cl.
CPC ............ *G06F 12/0246* (2013.01); *G06F 11/34* (2013.01); *G11C 2029/0409* (2013.01); *G11C 2029/4402* (2013.01); *G06F 15/7821* (2013.01)

(58) Field of Classification Search
CPC ............................ G06F 12/0246; G06F 11/34
See application file for complete search history.

(56) References Cited

U.S. PATENT DOCUMENTS

| 5,303,163 | A | 4/1994 | Ebaugh et al. | |
|---|---|---|---|---|
| 5,533,123 | A | 7/1996 | Force et al. | |
| 6,366,117 | B1 | 4/2002 | Pang et al. | |
| 6,708,273 | B1 | 3/2004 | Ober et al. | |
| 7,100,071 | B2* | 8/2006 | Olarig | 714/5.1 |
| 7,133,498 | B2 | 11/2006 | Cacioppo et al. | |
| 7,203,842 | B2 | 4/2007 | Kean | |
| 7,890,691 | B2* | 2/2011 | Jiang | 711/103 |
| 7,996,642 | B1 | 8/2011 | Smith | |
| 8,015,357 | B2* | 9/2011 | Strumper et al. | 711/118 |
| 8,171,204 | B2* | 5/2012 | Chow et al. | 711/103 |
| 8,572,311 | B1 | 10/2013 | Shalvi et al. | |
| 8,880,980 | B1 | 11/2014 | Mathew et al. | |
| 2001/0016390 | A1 | 8/2001 | Camerlenghi | |
| 2002/0114201 | A1 | 8/2002 | Aikawa et al. | |
| 2002/0140047 | A1 | 10/2002 | Cappelletti et al. | |
| 2003/0072190 | A1 | 4/2003 | Miki et al. | |
| 2004/0015674 | A1 | 1/2004 | Lakhani et al. | |
| 2004/0019754 | A1 | 1/2004 | Lin et al. | |
| 2004/0039845 | A1* | 2/2004 | Feldmeier et al. | 709/245 |
| 2004/0236954 | A1 | 11/2004 | Vogt et al. | |
| 2006/0219776 | A1 | 10/2006 | Finn | |
| 2006/0259848 | A1 | 11/2006 | Blevins | |
| 2007/0045425 | A1 | 3/2007 | Yoshida et al. | |
| 2007/0121575 | A1 | 5/2007 | Savry et al. | |
| 2007/0129812 | A1 | 6/2007 | Ferchau | |
| 2007/0136534 | A1* | 6/2007 | Mesard et al. | 711/137 |
| 2007/0234323 | A1* | 10/2007 | Franaszek et al. | 717/151 |
| 2007/0294494 | A1 | 12/2007 | Conti et al. | |
| 2008/0193133 | A1 | 8/2008 | Krug et al. | |
| 2008/0224731 | A1 | 9/2008 | Speers et al. | |
| 2008/0263117 | A1 | 10/2008 | Rose et al. | |
| 2008/0296664 | A1 | 12/2008 | Ramkumar et al. | |
| 2009/0049111 | A1 | 2/2009 | Chari et al. | |
| 2009/0103379 | A1 | 4/2009 | Zhang et al. | |

(Continued)

*Primary Examiner* — Hiep Nguyen

(57) ABSTRACT

A memory device can include a non-volatile memory array and control logic integrated with and distributed over the non-volatile memory array. The control logic can be operable to selectively distribute functionality across the non-volatile memory array.

31 Claims, 24 Drawing Sheets

(56) References Cited

U.S. PATENT DOCUMENTS

| | | |
|---|---|---|
| 2009/0165086 A1 | 6/2009 | Trichina et al. |
| 2009/0234916 A1 | 9/2009 | Cosentino et al. |
| 2009/0292871 A1 | 11/2009 | Watanabe et al. |
| 2010/0027788 A1 | 2/2010 | Tkacik et al. |
| 2010/0049751 A1 | 2/2010 | Giampaolo et al. |
| 2010/0064111 A1 | 3/2010 | Kunimatsu et al. |
| 2010/0070549 A1 | 3/2010 | Nagaraj |
| 2010/0115330 A1 | 5/2010 | Khatri et al. |
| 2010/0148232 A1 | 6/2010 | Ng et al. |
| 2010/0262773 A1 | 10/2010 | Borchers et al. |
| 2010/0293317 A1 | 11/2010 | Confalonieri et al. |
| 2011/0018070 A1 | 1/2011 | Dhaoui et al. |
| 2011/0022932 A1 | 1/2011 | Radke |
| 2011/0032766 A1 | 2/2011 | Fang et al. |
| 2011/0093675 A1 | 4/2011 | Lu et al. |
| 2011/0172498 A1 | 7/2011 | Olsen et al. |
| 2011/0224665 A1 | 9/2011 | Crosby et al. |
| 2012/0079318 A1 | 3/2012 | Colgrove et al. |
| 2012/0104483 A1 | 5/2012 | Shroff et al. |
| 2012/0147937 A1 | 6/2012 | Goss et al. |
| 2012/0172085 A1 | 7/2012 | Vuppu et al. |
| 2012/0179735 A1 | 7/2012 | Ferguson et al. |
| 2012/0198152 A1 | 8/2012 | Terry et al. |
| 2012/0233231 A1 | 9/2012 | Vasyltsov et al. |
| 2012/0233232 A1 | 9/2012 | Vergnes et al. |
| 2012/0265923 A1 | 10/2012 | Kuo et al. |
| 2012/0278584 A1 | 11/2012 | Nagami et al. |
| 2013/0007374 A1* | 1/2013 | Cain et al. .................. 711/137 |
| 2013/0013864 A1* | 1/2013 | Chung et al. ............... 711/130 |
| 2013/0290792 A1 | 10/2013 | Torla et al. |
| 2013/0332705 A1* | 12/2013 | Martinez et al. ............ 712/220 |
| 2014/0006898 A1 | 1/2014 | Sharon et al. |
| 2014/0040338 A1 | 2/2014 | Van Der Sluis et al. |
| 2014/0104966 A1 | 4/2014 | Oh et al. |
| 2014/0136583 A1 | 5/2014 | Hyde et al. |
| 2014/0143593 A1* | 5/2014 | Strauss et al. .............. 714/6.13 |

\* cited by examiner

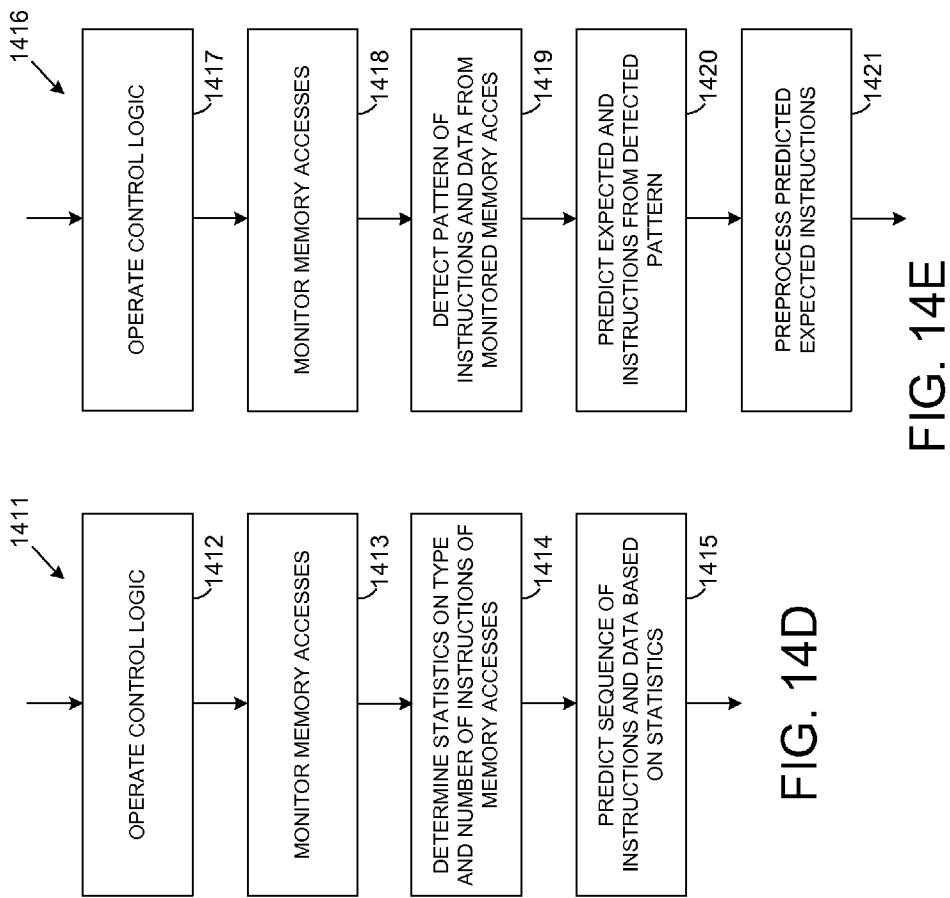

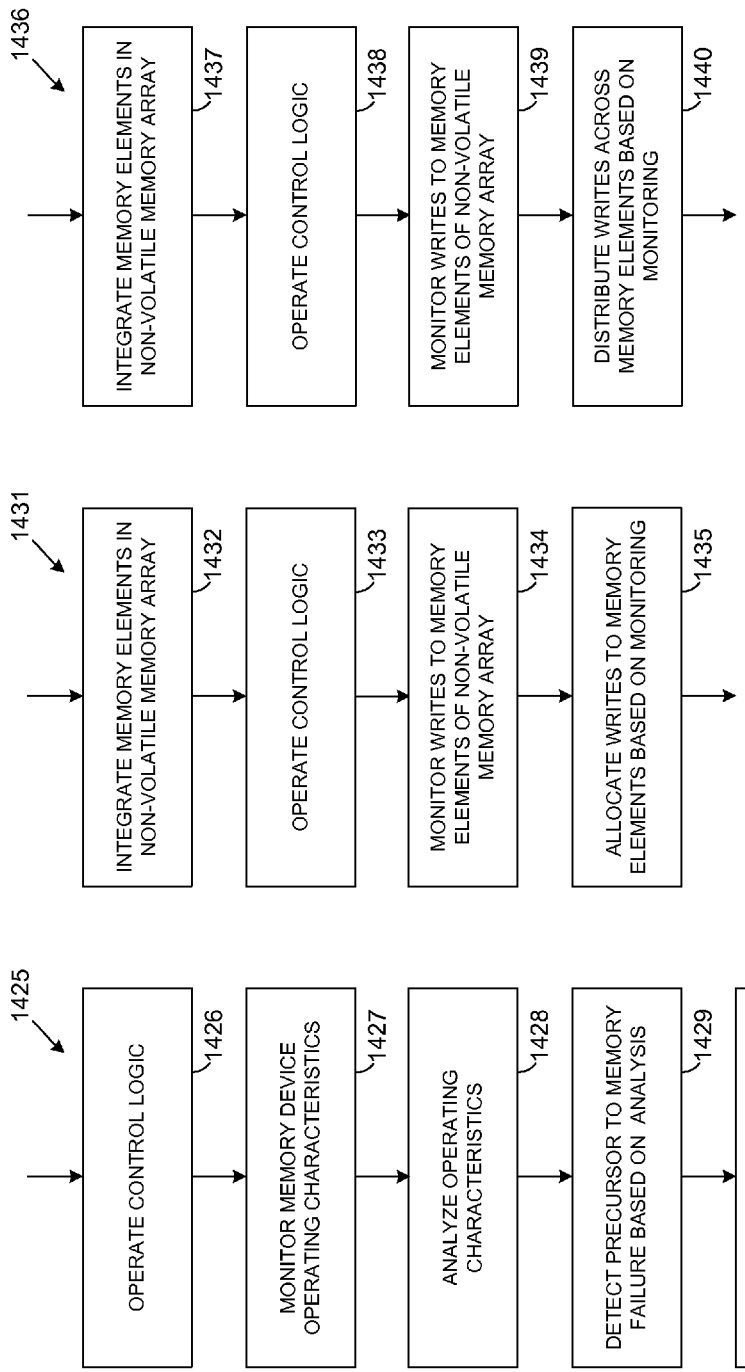

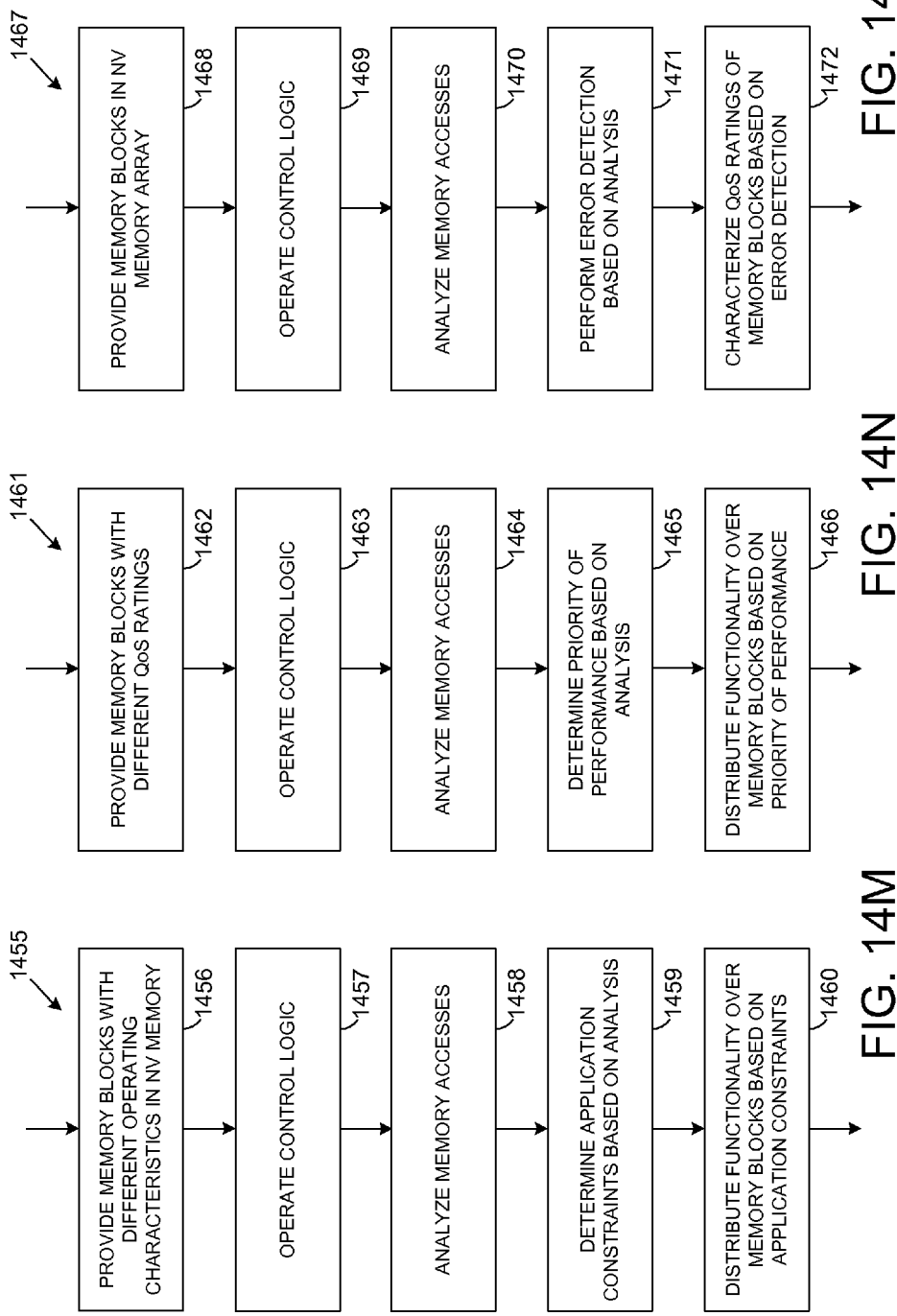

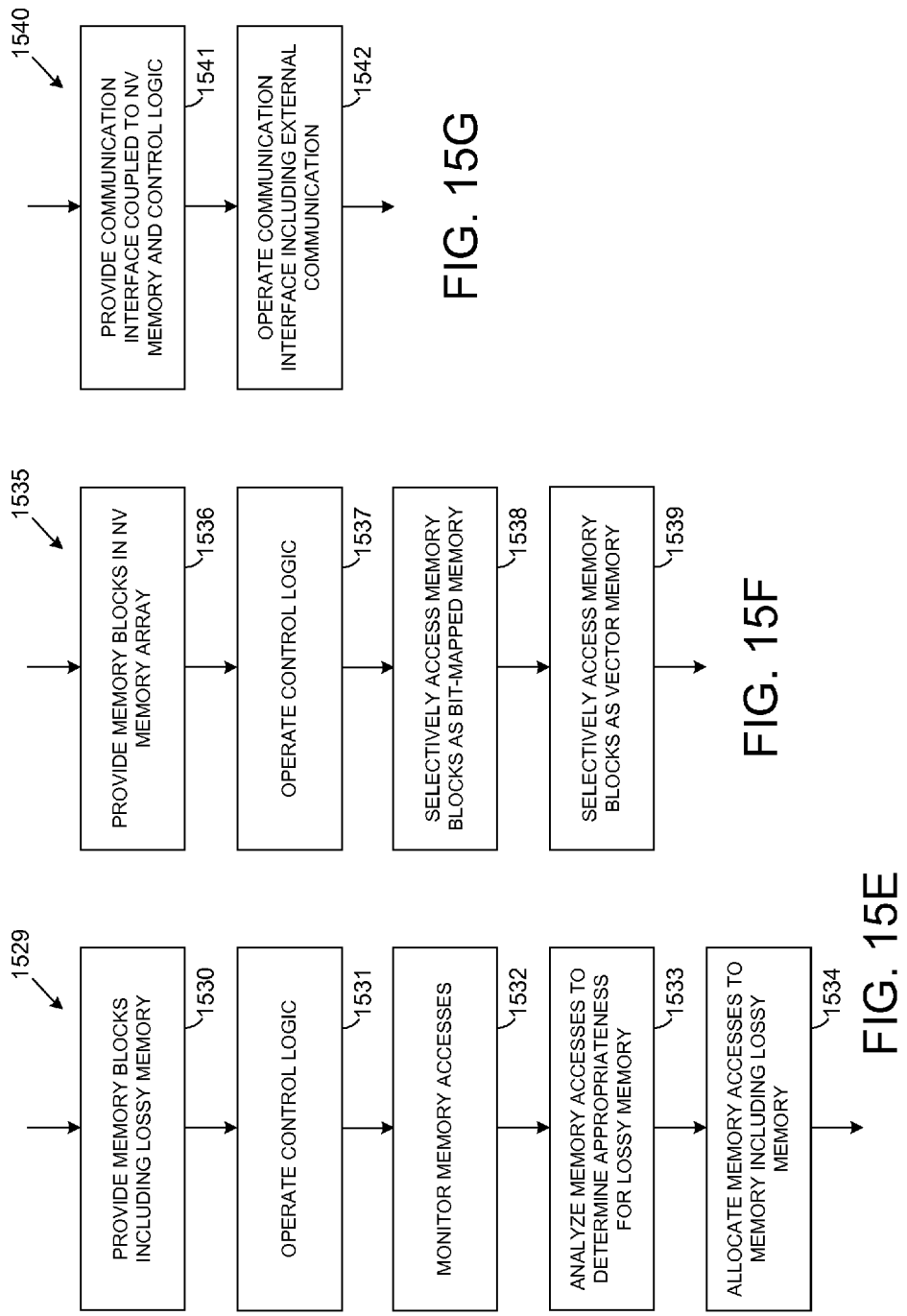

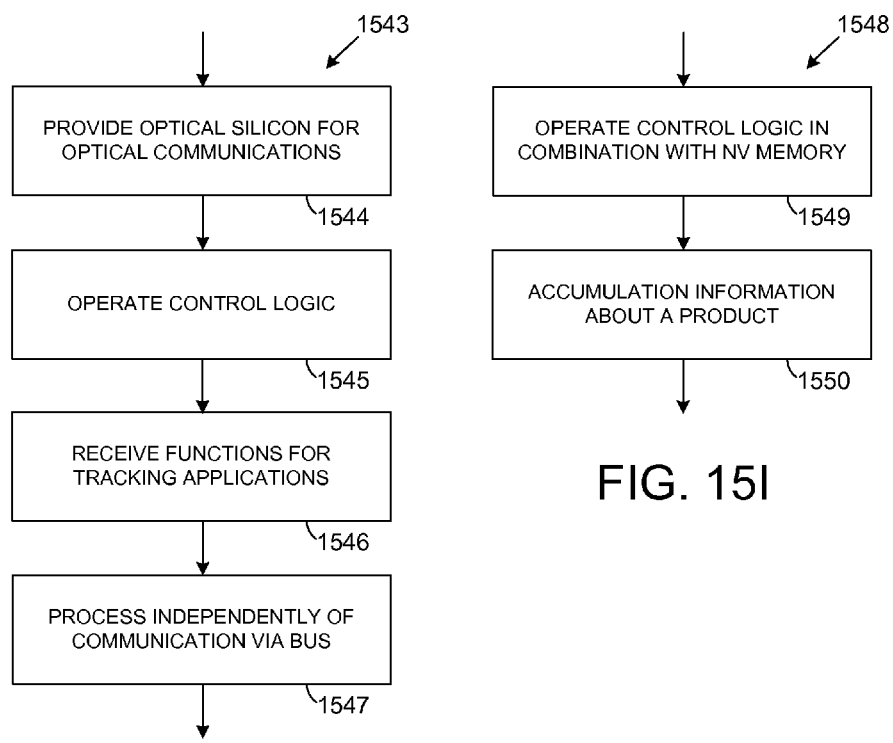

INTELLIGENT MONITORING FOR COMPUTATION IN MEMORY

CROSS-REFERENCE TO RELATED APPLICATIONS

The present application is related to and/or claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)). In addition, the present application is related to the "Related Applications," if any, listed below.

PRIORITY APPLICATIONS

None.

RELATED APPLICATIONS

U.S. patent application Ser. No. 13/678,439 entitled Redundancy for Loss-Tolerant Data in Non-Volatile Memory, naming Roderick Hyde, Nicholas Pasch, and Clarence T. Tegreene as inventors, filed 15 Nov., 2012, is related to the present application.

The United States Patent Office (USPTO) has published a notice to the effect that the USPTO's computer programs require that patent applicants reference both a serial number and indicate whether an application is a continuation, continuation-in-part, or divisional of a parent application. Stephen G. Kunin, Benefit of Prior-Filed Application, USPTO Official Gazette Mar. 18, 2003. The USPTO further has provided forms for the Application Data Sheet which allow automatic loading of bibliographic data but which require identification of each application as a continuation, continuation-in-part, or divisional of a parent application. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant has provided designation(s) of a relationship between the present application and its parent application(s) as set forth above and in any ADS filed in this application, but expressly points out that such designation(s) are not to be construed in any way as any type of commentary and/or admission as to whether or not the present application contains any new matter in addition to the matter of its parent application(s).

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

TECHNICAL FIELD

The present disclosure relates to electronic memory and systems associated with electronic memory.

SUMMARY

In one aspect, a memory device includes but is not limited to a non-volatile memory array, and control logic integrated with and distributed over the non-volatile memory array. The control logic is operable to selectively distribute functionality across the non-volatile memory array. The memory device may further include a bus integrated with the control logic and the non-volatile memory array. In addition to the foregoing, other aspects are described in the claims, drawings, and text forming a part of the present disclosure.

In one aspect, a method of operating a memory device can include providing a memory device including a non-volatile memory array and control logic integrated with and distributed over the non-volatile memory array. The method can further include operating the control logic operable to selectively distribute functionality across the non-volatile memory array.

In one aspect, a memory system includes means for storing information in a memory device including a non-volatile memory array, means integrated with and distributed over the non-volatile memory array for controlling the means for storing information, and means for selectively distributing functionality across the non-volatile memory array.

In one aspect, a system can be formed of circuitry. The system can include circuitry for storing information in a memory device including a non-volatile memory array, circuitry integrated with and distributed over the non-volatile memory array for controlling the means for storing information, and circuitry for selectively distributing functionality across the non-volatile memory array.

BRIEF DESCRIPTION OF THE DRAWINGS

Embodiments of the invention relating to both structure and method of operation may best be understood by referring to the following description and accompanying drawings:

FIGS. 14A through 14S and FIGS. 15A through 15I are schematic flow charts showing several embodiments and/or aspects of a method of operating a memory device for storing information to facilitate intelligent memory computation using control and/or computation logic integrated into memory.

DETAILED DESCRIPTION

Figure 1A:
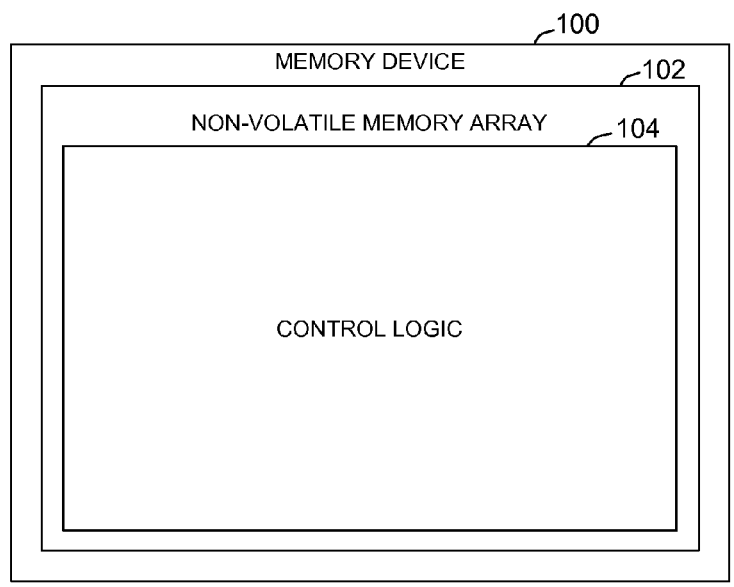
FIGS. 1A and 1B are multiple schematic block diagrams depicting embodiments of a memory device that is operable to perform intelligent memory computation using control logic that is distributed in memory.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

While various aspects and embodiments have been disclosed herein, other aspects and embodiments will be apparent to those having ordinary skill in the art. The various aspects and embodiments disclosed herein are for purposes of illustration and are not intended to be limiting, with the true scope and spirit being indicated by the following claims.

The various memory systems and devices disclosed herein are expected to be useful in many applications and contexts, and are further anticipated to be particularly useful in cloud computing and mobile contexts. In some configurations, the disclosed memory systems and devices can be used in system-on-a-chip (SOC) applications as processing and memory are distributed in more and more locations and applications throughout our technologically advancing society. The various memory systems and devices can include non-volatile memory including flash memory and electrically erasable programmable read-only memory (EEPROM) for usage in many electronic devices, such as mobile and cell phones, notebook computers, personal digital assistants, medical devices, medical diagnostic systems, digital cameras, audio players, digital televisions, automotive and transportation engine control units, USB flash personal discs, and global positioning systems.

In various applications and contexts, memory systems can include non-volatile memory integrated with a processor or other control logic, and a bus or other communications interface. As non-volatile memories and integrated system continue to evolve, their role in overall systems continue to expand to include various aspects of computation that is facilitated, for example, by phase-change memory in which passage of current switches a memory material between two states, crystalline and amorphous, or additional states that further elevate storage capacity.

Figure 1B:
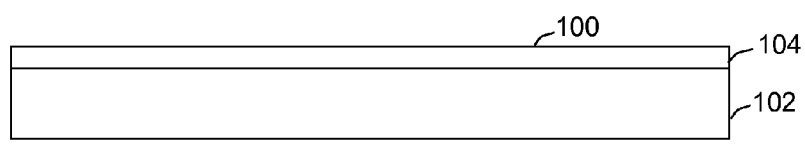

Referring to FIGS. 1A and 1B, multiple schematic block diagrams depict embodiments of a memory device that is operable to perform intelligent memory computation using control logic that is distributed in memory. In an illustrative embodiment, shown top and side views respectively in FIGS. 1A and 1B, a memory device 100 can include a non-volatile memory array 102 and control logic 104 that is integrated with and distributed over the non-volatile memory array 102. The control logic 104 can be operable to selectively distribute functionality across the non-volatile memory array 102.

The memory device can facilitate intelligent monitoring by virtue of a large distributed area of processing or logic which can be spread over a relatively large area of memory storage. In some embodiments, the processor can be formed of logic that is relatively low capability or relatively low quality, for example to enable a small number of relatively simple operations, thereby reducing the number of layers of silicon in the integrated circuit chip, and possibly reducing power requirements and heat dissipation. The processing logic of such a processor-in-memory (PIM) can be widely distributed over the area of memory storage. The intelligent monitoring memory device can be formed as at least part of a system-on-a-chip (SOC).

In various embodiments, the memory device can include control logic formed in a limited number of metal layers within the memory logic. To avoid stacking of multiple layers of silicon processing on the memory chip, the control logic can be spread laterally across the memory array circuitry. Limited complexity of operations implemented on the memory device circuit enables slower computation speed in comparison to a typical central processing unit (CPU). Such slower computation speeds are suitable since the limiting factor in transfers of data from a processor to memory is the data bus.

The control logic can be configured to reduce the percentage of transistor underutilization, called "dark silicon", by breaking up of the command structure of central blocks. The control logic can be further configured to enhance efficiency by performing background operations such as sorting of data within the memory while the system is idle.

In some embodiments, the memory device can be configured with control logic with an abbreviated set of specific, basic functions in which simple operations can be off-loaded from a processor external to the memory device and moved onto the memory device. For example, context request blocks can be removed from the processor into the memory device, for example for security purposes since the context request blocks are typically not located in the memory.

Embodiments of the memory device with a reduced-functionality control logic can facilitate efficient operation of the memory device while maintaining the integrated circuit simplicity and yield of the memory device. Typically, the number of metal layers in a memory integrated circuit is substantially smaller than that of a processor circuit. Reducing the complexity of the control logic can allow fabrication with fewer metal layers.

In various embodiments, functionality control logic can be attained by one or more of several techniques. For example, computations can be simplified by implementing relatively simple tasks in the control logic or by acknowledging that a particular section of the memory is predominantly subject to a limited number of simple operations which can be implemented in the control logic while other operations that rarely are applied to the memory section can be performed by processing external to the memory device. In another example, for operations or applications characterized by a limited or coarse accuracy, such as relatively low-grade video signals, processing can be based on estimation. In a further example, the control logic can include support for multiple functions in which circuitry for the different functions can be spread over a distributed area of the non-volatile memory array, forming a large distributed area of simple processing functionality.

Various techniques may be used for forming an integrated circuit with a combination of the non-volatile memory array and the control logic. In one example technique, an integrated circuit for a non-volatile memory cell transistor can be formed by constructing a layer of discrete storage cells over a substrate in two substrate regions, applying a dielectric layer over the layer of discrete storage cells in the two substrate regions, and building a barrier layer over the dielectric layer in the two regions. The barrier layer, dielectric layer, and the layer of discrete storage cells are then removed in one of the two substrate regions, leaving the layers intact in the other of the two substrate regions. An additional barrier layer is then formed over the substrate in the two substrate regions, then removed from the substrate region from which the barrier layer, dielectric layer, and the layer of discrete storage cells were previously removed. Two gates of a memory element are then formed respectively in the two substrate regions with one gate including a portion of the first barrier layer and another gate including a portion of the additional barrier layer. One aspect of fabricating a circuit that integrates the non-volatile memory array and the control logic on the memory device is selection of a suitable annealing process. For example, the illustrative integrated circuit can include a charge storage layer and a barrier layer formed over both a non-volatile memory region and a logic region. The charge storage layer can be formed of one or more layers and can include multiple discrete storage cells for storing charge which are isolated by a dielectric layer of insulating material with a suitably high dielectric constant. The charge storage layer can be constructed by depositing and annealing the discrete storage cells (for example, one or more of a silicon material such as polysilicon, silicon carbide, or the like, or a suitable metal such as germanium) on a dielectric area. The thermal annealing action can be performed by rapid thermal annealing (RTA) or a slower annealing process such as laser spike annealing (LSA). Memory properties can be selected and controlled by optimizing the annealing condition, thereby resulting in an improved reliability, write durability, and failure resistance.

In another example technique for forming an integrated circuit with a combination of the non-volatile memory array and the control logic, a non-volatile memory cell with improved charge retention on a substrate common with logic devices using a single-gate logic process in which a silicide-blocking dielectric barrier is formed over a floating gate of a non-volatile memory cell so that silicide cannot be formed over the floating gate but is formed over logic devices, thereby preventing bridging and silicide spiking in the non-volatile memory cell. The silicide-blocking dielectric barrier prevents silicide metal from contacting the floating gate or sidewall spacers while allowing the silicide metal in parts of active regions of the non-volatile memory cell at locations removed from the floating gate and spacers. The silicide regions can be constructed by initially depositing a refractory metal layer over the surface of the non-volatile memory cell, followed by a reactive anneal which causes the metal layer to react with the underlying contacted silicon regions to form silicide regions. A metal strip removed unreacted portions of the metal layer but leaves the silicide regions which are formed by a logic process using metals such as titanium, cobalt, nickel, or the like. A relatively slow annealing process can be used to produce suitable memory performance.

In a further example technique for forming an integrated circuit with a combination of the non-volatile memory array and the control logic, a scalable, logic transistor can be constructed with drain and source formed as a pair of doped regions and a gate insulator layer formed over the substrate and between the drain and source. A gate stack can include a gate layer (polysilicon or metal) between two metal nitride layers. A non-volatile memory transistor that is compatible with the logic transistor can be added via a high-K dielectric constant film with an embedded metal nano-dot layer between a tunnel insulator and the gate stack. The drain and source doped regions can be n+ regions doped into a p-type substrate to form an n-channel Field Effect Transistor (FET) device. The diffusion regions can be formed using n+ doped amorphous silicon, followed by an anneal such as a rapid thermal anneal (RTA) to reduce thermal budget and silicidation. A p-channel FET can similarly be formed via p+ diffusion source/drain regions applied over an n-well region. In other embodiments, annealing can be performed using a slow annealing process to improve memory performance and write durability while reducing stress and defects.

In an additional example technique for forming an integrated circuit with a combination of the non-volatile memory array and the control logic, non-volatile memory process steps can be added to a processor for forming high-voltage complementary metal-oxide semiconductor (CMOS) devices. The fabrication technique can include formation of isolation areas for the non-volatile memory and the high-voltage CMOS elements, forming high thermal drive process elements of both the memory and CMOS cells, forming mid thermal drive process elements of the logic CMOS cells, and forming low thermal process elements for logic CMOS, non-volatile memory, and high-voltage CMOS cells. Dopants for forming the devices can include masked implantation of boron, phosphorus and other species and subsequent annealing of the dopings, for example, using a slow annealing process to enhance charge retention in the memory devices.

The non-volatile memory can be formed of one or more of any non-volatile memory type or technology including read-only memory, flash memory, ferroelectric random access memory (F-RAM), magneto-resistive RAM (M-RAM) or the like.

In various embodiments, the memory device can include multiple types of memory technology, for example including charge memory or resistive memory. A memory device can include sections of charge memory and resistive memory and the control logic can assign applications to exploit the advantages and diminish the consequences of disadvantages of either type of memory. Charge memories induce a voltage which is detected during read operations in response to require amounts of charge. In nonvolatile storage, flash memories precisely control the discrete charge placed on a floating gate. In volatile storage, DRAM not only places charge in a storage capacitor but also mitigate subthreshold charge leakage through the access device using capacitors that are sufficiently large to store charge for reliable sensing and using transistors that are sufficiently large to exert effective control over the channel. Resistive memories use electrical current to induce a change in atomic structure, changing the resistance detected during reads. Resistive memories are more suitable for scaling than charge memories by avoiding precise charge placement and control. Programming via techniques such as current injection scale with cell size. Phase-change memory (PCM), spin-torque transfer (STT) magneto-resistive RAM (M-RAM), and ferroelectric RAM (FRAM) are examples of resistive memories.

Figure 2A:
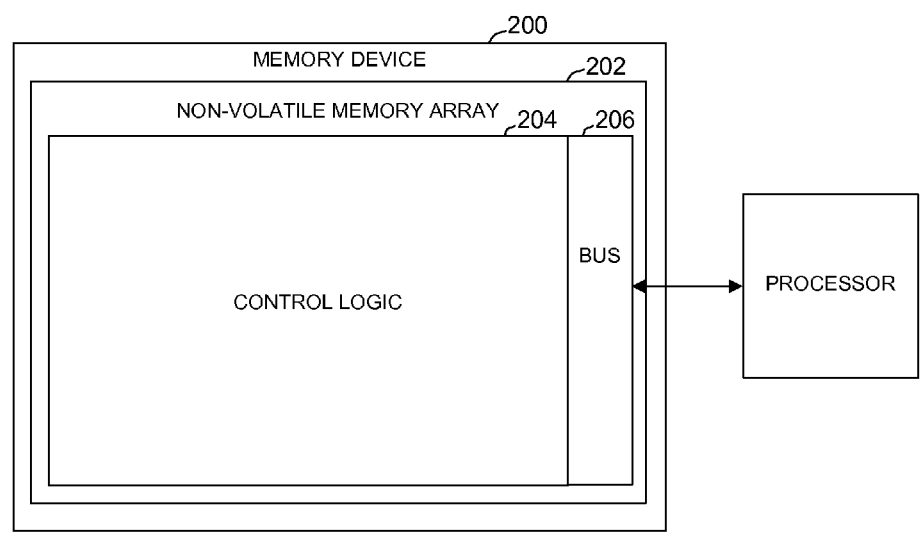
FIGS. 2A and 2B are schematic block diagrams showing respective top and side view of an embodiment of a memory device that is operable to perform intelligent memory computation using control logic that is distributed in memory and includes a bus for communication with devices external to the memory device.
Figure 2B:
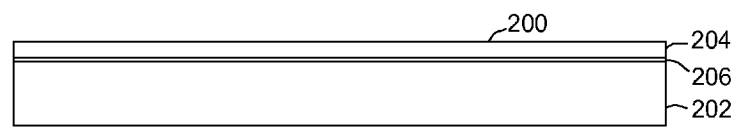

Referring to FIGS. 2A and 2B, schematic block diagrams show respective top and side view of an embodiment of a memory device that is operable to perform intelligent memory computation using control logic that is distributed in memory and includes a bus for communication with devices external to the memory device such as one or more processors. In various embodiments, the memory device 200 may further include a bus 206 integrated with the control logic 204 and the non-volatile memory array 204. The memory device can facilitate communication and handle additional bandwidth via usage of control logic that can predict subsequent transfers and write to memory accordingly to enable processing on the predicted data values. In some embodiments, the memory device can include communication channels in addition to the bus to facilitate transfer of information for various management functions, alleviating the traffic on the bus.

In some embodiments of the memory device depicted in FIGS. 1A, 1B, 2A, and 2B, the memory device 100, 200 can be configured such that the control logic 104, 204 is operable to monitor a history and pattern of memory accesses and perform sorting during system idle. Accordingly, the non-volatile memory array 102, 202 can be configured and operated to store a history of accesses, patterns of data calls, and the like. The control logic 104, 204 can be operable to perform operations such as sorting of data in the non-volatile memory array 102, 202 when the system is idle.

For example, the control logic can access, if available, background information about data characteristics and applications to tailor the memory to the currently-execute application.

In some embodiments, the memory device can include control logic that is configured to monitor current patterns in the memory and analyze using entropy laws, for example by determining the fluctuations in data using statistical mechanics techniques. The control logic can monitor memory accesses and determine the relative probability that the entropy of the data is currently outside an equilibrium level and so the data is expected to be characterized by increases or decreases over time. The entropy of an isolated system is expected to increase until reaching equilibrium.

In various embodiments, the memory device can include a non-volatile memory array which includes one or more suitable memory technology. For example, memory technologies in the memory device can include embedded flash, read-only memory (ROM), electrical fuse (one-time programmable), CMOS floating gate (multiple time programmable), CMOS floating gate (one-time programmable), and anti-fuse (one-time programmable). The different memory technologies can have various advantages and disadvantages for particular operations or applications. Some memory technologies can have relatively high density such as ROM and antifuse, while others have low density (for example electrical fuse and CMOS floating gate). Some technologies have good endurance such as embedded flash, and CMOS floating gate, while others have poor endurance, for example ROM, electrical fuse, CMOS floating gate, and antifuse. Various technologies can have different standby and active current including high current (electrical fuse), medium current (embedded flash and CMOS floating gate), and low current (ROM and anti-fuse). The memory technologies vary in random access time including fast (ROM and antifuse), medium (embedded flash and CMOS floating gate), and slow (electrical fuse). The memory technologies vary in security including high security (antifuse), medium security (embedded flash and CMOS floating gate), and slow security (ROM and electrical fuse). The memory technologies vary in high and low temperature and voltage tolerance including high tolerance (ROM and antifuse), medium tolerance (electrical fuse), and low tolerance (embedded flash and CMOS floating gate). In a memory device that includes multiple memory sections with more than one memory technology, the control logic can monitor a history and pattern of memory accesses and assign memory usage depending on the monitoring. For data or code that changes very frequently, the control logic can assign embedded flash. For high volume storage, the control logic can assign more dense memory technologies. For applications in which the code changes infrequently, the control logic can allocate, for example, ROM and antifuse. The control logic can assign memory accesses depending on temperature and voltage conditions that can be measured using sensors or otherwise communicated to the memory device. The control logic can determine the security level of an application and assign the memory technology accordingly.

In some embodiments, the memory device can include control logic that write-protects a selected location, block, or portion of memory. Subsequent erroneous write to the protected area can activate the control logic to perform predetermine handling such as repairing an error, performing an exit and restart, generating an error report, or the like.

In other example embodiments of the memory device depicted in FIGS. 1A, 1B, 2A, and 2B, the memory device 100, 200 can be constructed with control logic 104, 204 that is operable to monitor memory accesses and perform pattern recognition of the monitored memory accesses. In particular embodiments, the control logic can perform pattern recognition in an integrated circuit chip and perform analysis in operations that are background to data communication via a bus to a device such as a processor external to the memory device. Background tasks that are local to the memory device can include maximum and minimum sorting, medium, and mode computation. Operations perform by the control logic can include statistical measurements, indexing, synchronizing, detection of repetitive tasks, and the like.

Some embodiments of the memory device depicted in FIGS. 1A, 1B, 2A, and 2B, the memory device 100, 200 may include a capability to perform statistical analysis. Accordingly, the control logic 104, 204 can be operable to monitor memory accesses, determine statistics on type and number of instructions of the monitored memory accesses, and predict a sequence of instructions and data using the determined statistics. The control logic can oversee operations of an overall system, maintaining statistics on the type and number of instructions communicated and processed.

In certain applications and/or embodiments of the memory device depicted in FIGS. 1A, 1B, 2A, and 2B, the memory device 100, 200 can be formed such that the control logic 104, 204 is operable to monitor memory accesses, detect a pattern of instructions and data from the monitored memory accesses, predict expected instructions and data from the detected pattern of instructions and data, and preprocessing the predicted expected instructions. In some applications, the control logic can use the statistics to predict a future sequence of instructions and data. The control logic can detect patterns in which a first sequence of data and/or instructions is commonly followed by a second sequence. Upon detection of such a first sequence, the control logic can apply the second sequence to the memory without actually receiving the second sequence, for example from a processor via the data bus. Thus, the control logic can accelerate data handling and work throughput. The control logic can monitor data and/or instructions and anticipate requests for memory. The control logic can also detect an indexing pattern of instructions and interactions with memory using specialized logic that is integrated into the non-volatile memory area, enabling preprocessing of expected instructions within the memory.

The control logic thus can perform statistical operations that analyze instruction sequences to predict the type of instructions to perform using logic that is distributed within the non-volatile memory arrays of the memory device.

Some embodiments of the memory device depicted in FIGS. 1A, 1B, 2A, and 2B, the memory device 100, 200 can operate independently of external control, for example by a processor. Thus, the control logic 104, 204 can be operable to perform selective memory access and management operations independently of signals external to the memory device 100, 200.

In several embodiments and/or applications of the memory device depicted in FIGS. 1A, 1B, 2A, and 2B, the memory device 100, 200 can be configured with control logic 104, 204 that is operable to monitor operating characteristics of the memory device 100, 200, analyze the monitored operating characteristics, detect a precursor to a memory failure based on the analysis, and allocate memory accesses based on the detected precursor. Accordingly, the control logic can be used to predict how and when failures will take place using any suitable information for making the prediction. For example, the control logic can use temperature measurements to predict failure or use various forms of information to make predictions. In a particular embodiment, the control logic can enable writing data at a high rate in some conditions and limit writing speed in other conditions. For example, at high temperatures for a memory that is susceptible to failure, the control logic can limit writing speed to a low rate while allowing higher write data rates at lower temperature. In some applications or contexts, the control logic can perform performance mapping at selected time intervals, for example updating a map of sections of memory every 10,000 writes. The operating logic can determine how the memory is used and project back to determine characteristics of the operating environment.

Different types of memory can have different operating characteristics. The memory device can be formed of multiple memory segments that have different operating characteristics, for example in aspects of speed, power consumption, size, as well as susceptibility or resistance to particular operating conditions such as magnetic field characteristics, temperature, and voltage. The control logic can operate as a memory controller integrated with the non-volatile memory array to optimize for the particular memory type depending, for example, on application constraints such as the amount of computation, energy consumption load, and many other conditions. For example, control logic metadata can supplies intra-memory hints about heat generation.

For example, in some embodiments, the memory device can include both phase change memory (PCRAM) and other memory types and the control logic can assign memory usage according to various operating characteristics such as available power. In a specific example, PCRAM and DRAM may be selected based on power considerations. PCRAM access latencies are typically in the range of tens of nanoseconds, but remain several times slower than DRAM. PCRAM writes use energy-intensive current injection, causing thermal stress within a storage cell that degrades current-injection contacts and limits endurance to hundreds of millions of writes per cell. In a memory device that uses both PCRAM and DRAM, the control logic can allocate memory usage according to the write density of an application.

A memory device can allocate memory for a particular application or operation based on scalability, for example by determining whether a substantial number of storage cells is to be used. PCRAM can be a highly scalable memory technology since thermal resistivity increases, contact area decreases, and the volume of phase-change material to block current flow decreases with feature size. As feature size becomes smaller, contact area decreases quadratically, and reduced contact area causes resistivity to increase linearly, causing programming current to decrease linearly. Thus PCRAM can attain not only smaller storage elements but also smaller access devices for current injection, leading to lower memory subsystem energy. Thus, the control logic can allocate PCRAM segments to applications characterized by large memory use and density.

In some embodiments and/or applications, the memory device can be configured to allocate different portions of memory that have differing characteristics to specific applications. Some characteristics of memory can be better for some applications. For example, the control logic can assign data in high-speed operations to high-speed memory while assigning less time-critical applications to slower memory. The control logic can assign frequently updated information to memory types that are more durable to writes. In another example application, the memory device can be used in an end-to-end image storage system which includes multiple types of memory including multiple types of non-volatile RAM. For example, the memory device can be used to supply inexpensive memory such as memory stripes that are not part of a device such as a picture telephone, but is used to accumulate data (such as pictures) using some mirror communications that are facilitated by intelligence supplied by the control logic. In an example application, the control logic can activate to perform data communication when the memory device is in a location sufficiently proximal to the picture telephone to enable data transfer. The control logic can be used to detect that the picture telephone and the memory device are sufficiently close to perform a data transfer and, if so, operate in a low operation, low power mode to perform the data communication. Accordingly, the intelligence of the control logic can enable data transmission when the memory is in any location that is sufficiently close to the data source.

The memory device can thus be used for a wide variety of data communication operations to enable concentration of data originating from many sources. In particular arrangements, a memory device can include multiple types of memory with multiple memory characteristics in terms of cost, price, power, reliability, and the like. A memory device can be optimized to any desired characteristic such as memory quality, memory power, cost in terms of number of electrons, noise, power consumption, and others. For example, power consumption can be optimized by lowering access threshold. The control logic can be configured to determine the source of noise, for example if noisy during writing, the control logic can determine how little write current can be used, thereby reducing power consumption. The control logic can be used to monitor electrical characteristics such as power or charge. Only so many electrons are available in a memory and the control logic can be configured to determine how few electrons can be used to perform a particular operation such as read/write operations.

In some embodiments, the memory device can include some memory that is unacceptable for standard processing but very inexpensive and thus may have some usefulness and cost-effectiveness in some operations. For example, a relatively fast but error-prone memory may be useful for video processing. In various applications, the basis of memory quality may vary, for example, error rate, speed, and the like.

The memory device can include multiple types of memory including the non-volatile memory array in the form of multiple types of non-volatile memory technologies, in addition to portions of memory that may be volatile. The memory device may include multiple types of memory for use in a redundant fashion. Accordingly, the memory device can include two or more memory segments of any non-volatile memory type or technology including read-only memory, flash memory, ferroelectric random access memory (F-RAM), magneto-resistive RAM (M-RAM) or the like. The control logic can operate a segment of M-RAM which is comparable in speed and capacity to volatile RAM while enabling conservation of energy, rapid or instantaneous start-up and shutdown sequences. In other applications, the memory device can include memory in the form of charge-coupled devices (CCDs) that are not directly addressable or other pure solid state memory that is reliable and inexpensive for use as separate memory device for various applications such as cell phones, and the like.

In a memory device that includes multiple different types of memory including a spin-transfer M-RAM, the control logic can assign functionality at least in part based on the magnetic properties of memory. In a system that includes at least one portion of F-RAM, the control logic can exploit operating characteristics of extremely high endurance, very low power consumption (since F-RAM does not require a charge pump like other non-volatile memories), single-cycle write speeds, and gamma radiation tolerance. The memory device can include different segments of different types of memory including volatile and non-volatile memory, flash, dynamic RAM (DRAM) and the like, and use the control logic to attain different performance/cost benefits.

The memory device can, in addition to including multiple types of memory, can include multiple different classes of memory of the same memory type to attain a desired operating characteristic. The different classes of memory may include memory of the same technology with different operating parameters or different fabrication process parameters. The different classes of memory may be formed with different polysilicon types, different metal types, different silicides or salicides, various source, gate, and spacer dimensions, different annealing processes, and any other suitable variation in fabrication technique.

In some embodiments and/or applications, the control logic can allocate instruction cache and data cache depending on the application and environment. In further arrangements, the control logic can also select physical locations of memory depending on application and operating environment.

Thus, the control logic can be operable to perform maintenance operations of the memory in response to physical phenomena imposes on the memory. For example, the memory device can incorporate sensors or other components that detect phenomena which can be monitored by the control logic to detect magnetic fields, electrical conditions, temperature, and the like to enable the control logic to perform actions to maintain, repair, clean, or other operations applied to the memory.

Figure 3A:
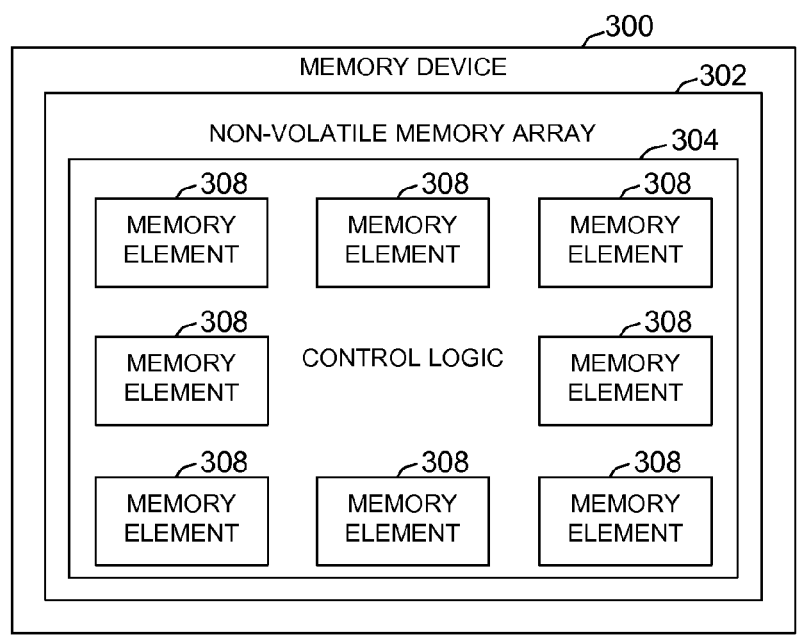
FIGS. 3A and 3B are respective top and side views of schematic block diagrams illustrating embodiments of a memory device that is operable to perform intelligent memory computation using control logic that is distributed in memory with multiple memory elements.
Figure 3B:
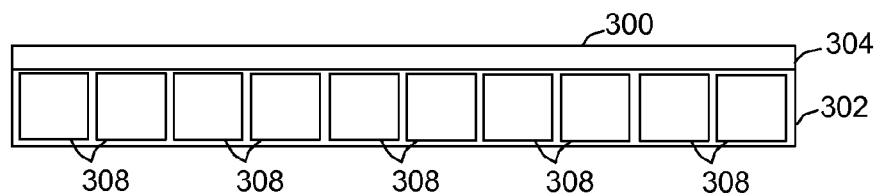

Referring to FIGS. 3A and 3B, respective top and side views of schematic block diagrams illustrate embodiments of a memory device that is operable to perform intelligent memory computation using control logic that is distributed in memory with multiple memory elements. Various embodiments of the memory device 300 can be adapted to address wear caused by excessive writing. For example, the memory device 300 can be formed with non-volatile memory array 302 that includes a plurality of memory elements 308. The control logic 304 can be operable to monitor writes to the plurality of memory elements 308 of the non-volatile memory array 302 and allocate writes to the memory elements 308 based on results of the monitoring.

One problem inherent to non-volatile memory is failure that results from multiple writes to a memory element. The control logic can operate to suitably allocate and distribute writes to non-volatile memory cells to avoid or prevent failure, for example by shifting through memory as particular cells are written or by allocating newer or less-written memory to operations, applications, or contexts characterized by a requirement for higher accuracy.

In an example embodiment, the memory device can include control logic can allocate writes according to memory type. For example, the memory device can include a section of PCRAM. Writes can result in substantial wear in PCRAM. When current is injected into a volume of phase-change material, thermal expansion and contraction degrade the electrode storage contact, resulting in programming currents injected into the memory cell that are insufficiently reliable. PCRAM material resistivity is highly dependent on current injection so that current variability leads to resistance variability, degrading the read window of suitable programmed minimum and maximum resistances. Accordingly, the control logic and monitor and determine applications characterized by repeated and enduring writes, and allocate such applications to memory segments other than PCRAM segments.

A memory device can be configured with control logic that is operable to mitigate wear and energy. For example, PCRAM, which is susceptible to wear and failure for high levels of writing to a PCRAM cell over a memory lifetime, can be managed using mitigation techniques of write reduction and leveling to improve PCRAM endurance. In a particular operation, the control logic can allocate some memory to function as a cache and track written cache lines and written cache words to implement partial writes and reduce wear. In another technique, the control logic can monitor writes to eliminate redundant bit writes. In a typical memory access, a write updates an entire row of memory cells, many of which are redundant. The control logic can remove the redundant bit writes and thereby substantially increase memory lifetimes, for example by preceding a write with a read and compare. Following the read, an XNOR gate can be used to filter redundant bit-writes. A PCRAM read is sufficiently faster than a PCM write and writes are less latency critical, so the performance reduction from reading before a write is in consequential.

In addition to eliminating redundant writes, the control logic can also improve write wear performance by row shifting. After removing redundant bit writes, bits most written in a row tend to be localized so that the control logic can perform simple shifting to more evenly distribute writes within a row.

The control logic can attain additional wear improvement by segment swapping in which memory segments of high and low write accesses are periodically swapped. The control logic can track write counts and manage a mapping table between segments.

In another example embodiment, the memory device can include control logic operable to allocate memory according to wear such as by limiting the frequency of allocation for a particular memory block and by maintaining frequently changing metadata in DRAM that is separate from managed blocks of non-volatile memory.

Embodiments of the memory device can perform wear-leveling via managed allocation. For example, the control logic can avoid allocation of a newly released memory block but rather time-stamp the block and add the block to a first-in-first-out queue. On subsequent allocations or releases, the control logic can examine the block at the head of the queue and, if resident on the queue for a sufficient time, can remove the block from the queue and mark eligible for re-allocation. The control logic can maintain list pointers in headers and footers of freed blocks and update the list pointers when adjacent free blocks are merged into a larger free region. In another technique, the control logic can track the allocated or free state of memory blocks using a DRAM bitmap and manage the bitmap dynamically during operations.

In additional embodiments, the memory device 300 can be configured with non-volatile memory array 302 that includes a plurality of memory elements. The control logic 304 can be operable to monitor writes to the plurality of memory elements 308 of the non-volatile memory array 302 and distribute writes across the memory elements 308 based on results of the monitoring.

In an example arrangement, the memory device can include memory of two types, such as non-volatile RAM (NVRAM) and DRAM in combination with control logic that allocates memory accesses for the NVRAM. The control logic prevents frequent reuse of memory locations and stores frequently-changing metadata in DRAM. The control logic can also add checksums to detect and correct corruption.

In embodiments adapted to promote write durability, the memory device can include a non-volatile memory array with multiple types of memory including at least one portion of memory characterized by elevated write endurance. In a particular embodiment, the non-volatile memory array can include at least on portion formed of M-RAM which is based on a tunneling magneto-resistive (TMR) effect. The individual M-RAM memory cells include a magnetic tunnel junction (MTJ) which can be a metal-insulator-metal structure with ferromagnetic electrodes. A small bias voltage applied between the electrode causes a tunnel current to flow. The MTJ is exposed to an external magnetic field and forms a hysteresis loop with two stable states, corresponding to 0 and 1 data states at zero magnetic field. M-RAM is characterized among non-volatile memory technologies as having excellent write endurance with essentially no significant degradation in magneto-resistance or tunnel junction resistance through millions of write cycles. Accordingly, the control logic can monitor and determine whether a particular application or process is characterized by frequent, enduring write operations and assign a portion of M-RAM to handle memory accesses.

Another memory technology characterized by write endurance is ferroelectric RAM (FeRAM). FeRAM can be constructed using material such as lead-zirconate-titanate (PZT), strontium-bismuth-tantalate (SBT), lanthanum substituted bismuth-tantalate (BLT), and others. An externally applied electric field causes polarization of the FeRAM material to be switched and information retained even upon removal of the field. In absence of the electric field, polarization has two distinct stable states to enable usage in memory storage. FeRAM can have write endurance at the level of M-RAM and is further characterized by a reduced cell size and thus higher density. Thus, the control logic can monitor and determine whether a particular application or process is characterized by frequent, enduring write operations in combination with a relatively large number of storage cells. The control logic can assign a portion of FeRAM to handle memory accesses.

Figure 4A:
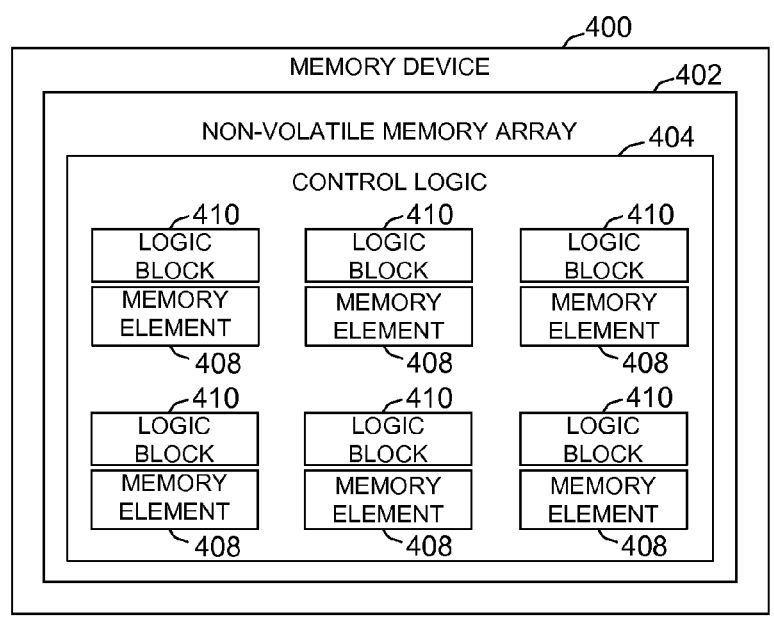
FIGS. 4A and 4B are respective top and side views of schematic block diagrams depict embodiments of a memory device that is operable to perform intelligent memory computation using control logic that is distributed in memory with multiple command logic blocks associated with multiple memory elements.
Figure 4B:
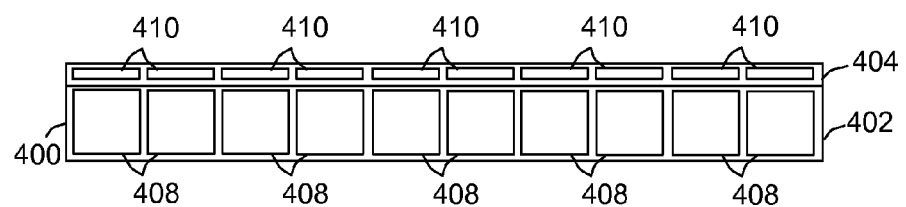

Referring to FIGS. 4A and 4B, respective top and side views of schematic block diagrams depict embodiments of a memory device that is operable to perform intelligent memory computation using control logic that is distributed in memory with multiple command logic blocks associated with multiple memory elements.

In various embodiments and/or applications, the memory device 400 can be configured such that the non-volatile memory array 402 is partitioned into a plurality of memory blocks 408, and the control logic 404 is partitioned into a plurality of command logic blocks 410 which are spatially distributed over the non-volatile memory array 402 in a manner that one or more of the plurality of command logic blocks 410 are associated with one or more of the plurality of memory blocks 408.

In some applications and/or embodiments, different memory blocks can be allocated for respective different functionality so that the command logic blocks can support functionality that is specific to the appropriate memory blocks.

In additional embodiments and/or applications of the memory device depicted in FIGS. 3A, 3B, 4A, and 4B, the memory device 300, 400 can be adapted for functionality and behavior that differs with memory type. For example, the memory device 300, 400 can be configured such that the non-volatile memory array 302, 402 includes a plurality of memory blocks 308, 408 characterized by a plurality of different operating characteristics. The control logic 304, 404 can be operable to selectively distribute functionality over the plurality of memory blocks 308, 408.

In one or more embodiments of the memory device depicted in FIGS. 3A, 3B, 4A, and 4B, the memory device 300, 400 can have non-volatile memory array 302, 402 which includes a plurality of memory blocks 308, 408 characterized by a plurality of different operating characteristics with control logic 304, 404 that is operable to analyze memory accesses and selectively distribute functionality over the plurality of memory blocks 308, 408 based on the analysis.

In additional operating characteristic-variant embodiments of the memory device depicted in FIGS. 3A, 3B, 4A, and 4B, the memory device 300, 400 can have non-volatile memory array 302, 402 that includes a plurality of memory blocks 308, 408 characterized by a plurality of different operating characteristics. The control logic 304, 404 can be operable to analyze memory accesses, determine application constraints based on the analysis, and selectively distribute functionality over the plurality of memory blocks 308, 408 based on the determined application constraints.

Other embodiments of the memory device depicted in FIGS. 3A, 3B, 4A, and 4B, the memory device 300, 400 can take memory quality of service into consideration. The memory device 300, 400 can have a non-volatile memory array 302, 402 including a plurality of memory blocks 308, 408 characterized by a plurality of different Quality-of-Service (QoS) ratings. The control logic 304, 404 can be operable to analyze memory accesses, determine priority of performance based on the analysis, and selectively distribute functionality over the plurality of memory blocks 308, 408 based on the determined priority of performance. For example, the control logic can allow less-than-perfect performance for suitable applications and/or contexts. The control logic can determine and use QoS ratings for processor in memory (POM), and assign priority of performance to sections of memory. For relatively high performance applications, the device may be configured to work perfectly and the control logic can specify that only highly reliable memory is used. Other applications can operate at a lower QoS and the control logic can select memory accordingly.

The non-volatile memory array can include memory portions formed of memory technologies characterized by high performance under particular operating conditions. Phase change RAM (PCRAM) is a memory technology with highly favorable small cell size and thus density. The memory device which includes at least a portion of PCRAM can further include control logic that monitors and determines operating conditions and can assign memory accesses to PCRAM in low power high performance conditions.

Other examples of non-volatile memory technologies with various QoS ratings can include resistive RAM (R-RAM) and spin-transfer torque RAM (STT-RAM). R-RAM can be any memory technology that relies of resistance change to store information, for example including space-charge-limited-current (SCLC), filament, programmable-metallization-cell (PMC), Schottkey contact and traps (SCT). R-RAM can be characterized by non-volatility, high-speed, high-performance, zero standby power, and, in some arrangements, high density. For a memory device that includes at least a portion of the memory in the form of R-RAM, the control logic can monitor memory accesses and determine whether a particular application is characterized by high-speed and high-performance, and assign the R-RAM memory portion for the application.

In another example application, a memory device can include a non-volatile memory array and includes at least a portion of the memory in the form of STT-RAM. STT-RAM can be characterized by improved performance via overdriving. Overdriving the gate voltage of an NMOS transistor in the STT-RAM can increase $V_{GS}$ and thus enhance the driving strength of the NMOS transistor. The control logic can be configured to manage overdriving, for example, by monitoring memory access operations such as reading, writing, erasing, driving write-line voltage, and the like, and control overdriving according to the particular application.

In some example embodiments of the memory devices depicted in FIGS. 3A, 3B, 4A, and 4B, the non-volatile memory array 302, 402 can include a plurality of memory blocks 308, 408. The control logic 304, 404 can be operable to analyze memory accesses, perform error detection based on the analysis, and characterize Quality-of-Service (QoS) ratings of the plurality of memory blocks 308, 408 based on the performed error detection. For example, the control logic can determine and use QoS ratings, and assign priority of performance to sections of memory. For relatively high performance applications, the device may be configured to work perfectly and the control logic can specify that only highly reliable memory is used. The control logic can perform an error detection operation and determine whether too many errors are occurring according to a predetermined threshold and, if so, the control logic can shift to higher performing memory. The control logic can start an application with a determined QoS rating and monitor errors to iteratively select an appropriate memory segment that is tailored to application characteristics and performance.

In further embodiments of the memory devices depicted in FIGS. 3A, 3B, 4A, and 4B, the memory device 300, 400 can be arranged in which the non-volatile memory array 302, 402 includes a plurality of memory blocks 308, 408. The control logic 304, 404 can be operable to monitor writes to the plurality of memory blocks 308, 408 of the non-volatile memory array 302, 402 and allocate writes to the memory blocks 308, 408 based on results of the monitoring.

In various embodiments of the memory devices depicted in FIGS. 3A, 3B, 4A, and 4B, the memory device 300, 400 can be configured with a non-volatile memory array 302, 402 that includes a plurality of memory blocks 308, 408. The control logic 304, 404 can be operable to monitor operating characteristics of the memory device 300, 400, analyze the monitored operating characteristics, detect a precursor to a memory failure based on the analysis, and allocate memory accesses among the plurality of memory blocks 308, 408 based on the detected precursor.

In further example embodiments of the memory devices depicted in FIGS. 3A, 3B, 4A, and 4B, the memory device 300, 400 can be arranged with non-volatile memory array 302, 402 that includes a plurality of memory blocks 308, 408. The control logic 304, 404 can be operable to receive a report on at least one operating condition of system performance at system bootstrap loading and allocate functionality among the plurality of memory blocks 308, 408 based on the report. An operation at bootstrap loading can cause the system to report on the operating condition of all components (including all chunks of memory) to enable allocation of functionality based on performance of the components.

In a particular application, the memory device can include control logic that restores a persistent application state by mapping non-volatile memory pages across system reboot operations, for example by mapping non-volatile RAM pages in different processes including processes that are not necessarily concurrent. The control logic can also support access control in portions of the non-volatile RAM in the manner of file system access control.

In some applications, what is desired is a capability to store large amounts of data while allowing some amount of inaccuracy or error. Such an application can be video streaming. The memory device can thus be formed with at least a portion of the memory that is very inexpensive but very lossy.

Some types of memory can be susceptible to failure under specified conditions. For example, two-terminal non-volatile memory devices based on resistance switching effects, called memristors, are susceptible to damage from temperature and bias field conditions. Placing a memristor in an oven or applying a bias field can erase the entire memory. A memory device can include a portion of memory which is susceptible to a particular condition and another, redundant portion which is resistant to the condition, thereby enabling operation in a RAID (redundant array of independent disk) array fashion to ensure retention of data during condition episodes. In case of accidental erasure, the control logic can perform functionality analogous to that of a RAID array, for example, to use a slow memory that is impervious to magnetic fields to rebuild the erased data. In a particular embodiment, the slow memory can maintain hash tables are can be heat or magnetic-resistant. A two-way hash can be used to represent data as a hash, thereby reducing memory size.

For a memory device that includes sufficiently large and inexpensive memory, the control logic can perform a copy function at predetermined intervals, for example every 50 cycles or other selected rate, to copy the state to a redundant fast memory for copying to a slow memory, and to facilitate decision-making in memory. Thus, the memory can control sampling with the control logic including sampling functionality, and sampling of fast memory. For applications or contexts such as video handling in which only intermittent frames are sufficient to produce a suitable video image, a backup into lossy memory may be suitable to enable a basic recovery of data. In some embodiments, the memory device may include excess memory in the form of flip-chip via a dedicated bus to send data from a first fast memory to a second fast memory.

The memory device can include control logic that facilitates accessing of memory based on a determination of the type of operations being performed. For example, the control logic can detect high traffic in video streaming and modify data handling to shift from 16-bit byte memory accesses to accessing of blocks of data. For cloud computing applications which are limited by bandwidth, the control logic in the locally-controlled memory device can push all physical parameters off an external processor into the memory device, avoiding the bandwidth limitation and enabling additional memory-local capability including potentially different error correction algorithms. The memory device can thus enable a large scale memory with local control, such as a video memory with frame buffers or a dedicated image memory.

In some applications and/or embodiments, a memory device can incorporate reduced data set redundancy in which a data copy can be compressed in a suitable manner. The control logic can perform redundant data management relatively slowly, avoiding the heat buildup that can result from a fast data transfer. Thus, redundant backup memory buses can be run at comparatively slow speed, thereby avoiding a significant increase in the heat budget for redundancy processing.

The control store can be configured to enable new operations. For example, the control logic can be configured to facilitate efficient memory accesses. In a particular example, the control logic can support a particular type of special image store which stores information of a particular size and form efficiently in memory, that writes different memory elements concurrently to a value that is suitable according to characteristics of the incoming image data. Special instructions can be used that can efficiently perform transforms on the image data.

In various applications and/or embodiments of the memory devices depicted in FIGS. 3A, 3B, 4A, and 4B, the memory device 300, 400 can be configured to perform error detection and/or error correction independently of a processor that is external to the memory device 300, 400. Accordingly, the memory device 300, 400 can be formed such that the non-volatile memory array 302, 402 includes a plurality of memory blocks 308, 408 characterized by a plurality of different operating characteristics. The control logic 304, 404 is operable to perform a plurality of error correction algorithms and selectively allocate ones of the plurality of error correction algorithms to ones of the plurality of memory blocks 308, 408.

In a particular embodiment, the memory device can include the non-volatile memory array which is inexpensive and can be maintained in close proximity to other types of memory either internal to the memory device or in a nearby integrated circuit chip. The control logic can be configured to perform bit-error correction by maintaining multiple copies of data in the high capacity enabled by non-volatile memory arrays, rather than the bit-checks of other error correction techniques. The multiple copies of data in the non-volatile memory can be used to occasionally detect errors using the multiple data copies. Accordingly, the memory device can include a relatively high capacity non-volatile memory array with high capacity and control logic operable to perform error correction. The high capacity in non-volatile memory can be used for error detection and correction in which redundant data is held in the non-volatile memory for error correction in the form of multiple data copies to enable recovery by the receiving memory even when a number of errors up to the capability of the code in use are introduced during transmission or on storage. Errors can be corrected without requesting retransmission by the sender.

In some embodiments of the memory devices depicted in FIGS. 3A, 3B, 4A, and 4B, the memory device 300, 400 can manage memory accesses based on workload. Accordingly, the memory device 300, 400 can have non-volatile memory array 302, 402 which includes a plurality of memory blocks 308, 408. The control logic 304, 404 can be operable to access a time signal and monitor memory accesses referenced by the time signal, analyze workload based on the monitored memory accesses, and allocate memory accesses among the plurality of memory blocks 308, 408 based on the analyzed workload.

For example, the memory device can include control logic that takes into consideration that, at different times, the loads are expected to be different. In a particular instance, the memory device may be used in a data center in which some of the activity is work-related, and other activity is recreational. The control logic can be configured to allocated different types of memory accordingly, for example to handle volumes of streaming video and audio content during non-working hours.

Figure 5A:
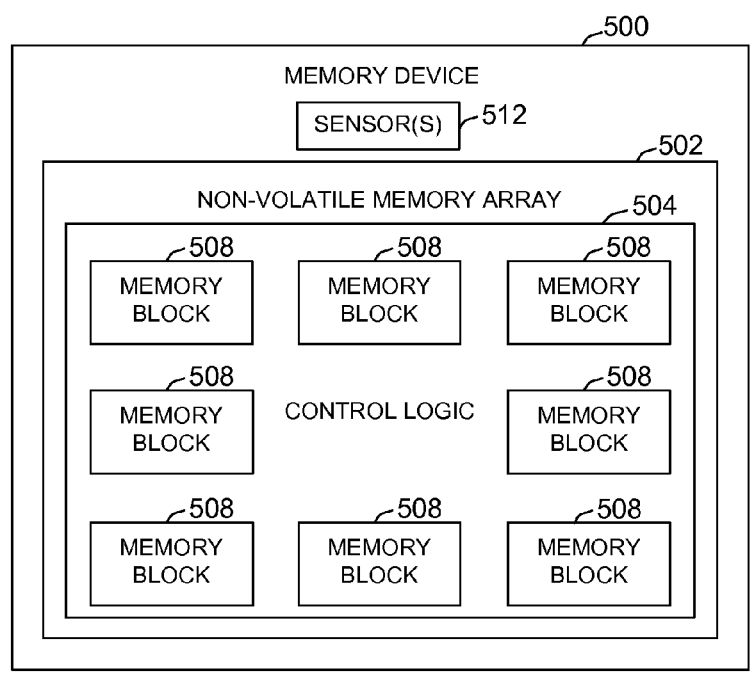
FIGS. 5A and 5B are respective top and side views of schematic block diagrams illustrating embodiments of a memory device that is operable to perform intelligent memory computation using control logic that uses one or more sensors to facilitate management of the memory.
Figure 5B:
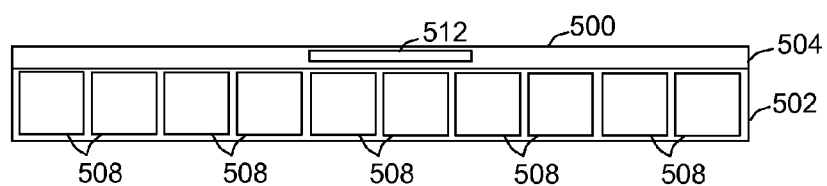
Figure 6A:
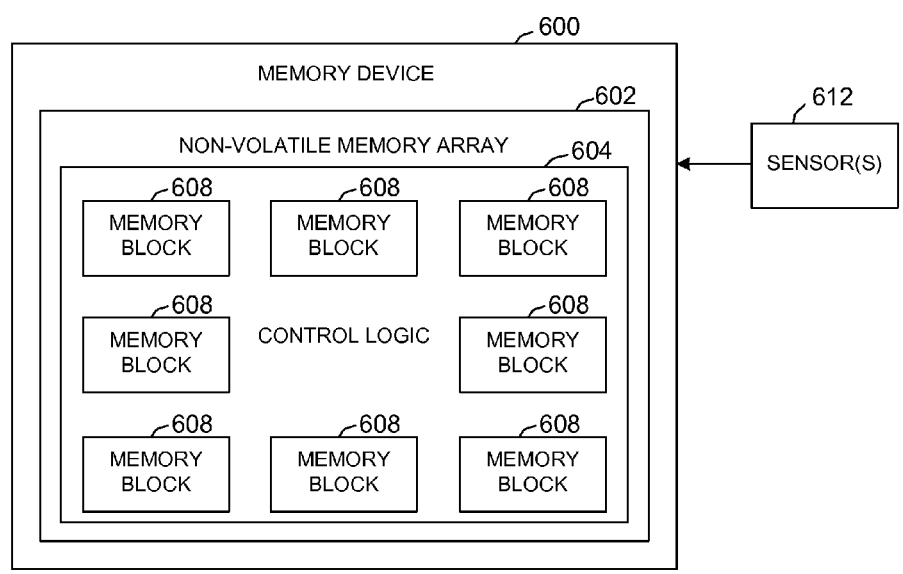
FIGS. 6A and 6B are respective top and side views of schematic block diagrams showing additional embodiments of a memory device that is operable to perform intelligent memory computation using control logic that uses one or more sensors to facilitate management of the memory.
Figure 6B:
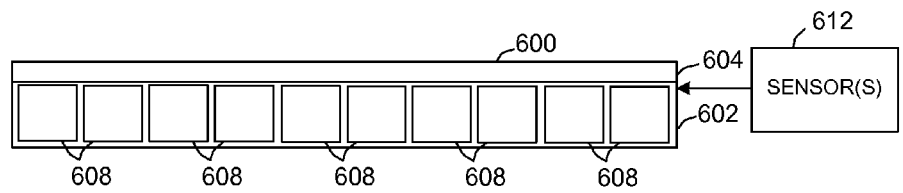

Referring to FIGS. 5A and 5B, respective top and side views of schematic block diagrams illustrate embodiments of a memory device that is operable to perform intelligent memory computation using control logic that uses one or more sensors integrated with the memory device to facilitate management of the memory. FIGS. 6A and 6B, respective top and side views of schematic block diagrams illustrate embodiments of a memory device that is operable to perform intelligent memory computation using control logic that uses one or more sensors external to the memory device to facilitate management of the memory. Various embodiments of the memory device 500, 600 can include one or more sensors to determine who to control or manage storage in memory. In a particular example embodiment, the memory device 500, 600 can further include at least one sensor 512, 612 that is operable to detect an operating condition. The non-volatile memory array 502, 602 can include a plurality of memory blocks 508, 608. The control logic 504, 604 can be operable to monitor the operating condition, analyze the monitored operating condition, detect a precursor to a memory failure based on the analysis, and allocate memory accesses among the plurality of memory blocks 508, 608 based on the detected precursor.

The memory device can include any suitable sensor for detecting a condition that may be useful for allocate memory usage. Example sensors can measure voltage, current, capacitance, resistance, capacitive/resistive, and other electrical or magnetic phenomena. Other suitable sensors can sense touch, tactile phenomena, pressure, vibration, gyro, inertia, angular velocity, and the like. Some sensors can sense ionic, optical, electrochemical, infrared, temperature, and the like.

In an embodiment of a memory device that includes multiple memory types or technologies, the sensor can detect electrical characteristics such as voltage or current and the control logic can determine whether the energy drive is sufficient to drive the memory reliably. If the energy drive is insufficient for a particular type of memory, the control logic can shift memory accesses to a memory type that can be reliably driven.

In other embodiments and/or applications of the memory devices depicted in FIGS. 5A, 5B, 6A, and 6B, the memory device 500, 600 can include at least one sensor 512, 612 operable to detect an operating condition, and the control logic 504, 604 can be used to predict future operations that are appropriate based on the sensed operating condition. The control logic 504, 604 can be operable to monitor the operating condition, monitor memory accesses, analyze the monitored operating conditions and memory accesses, predict expected outcomes based on the monitored operating conditions and memory accesses, and allocate memory accesses based on the predicted expected outcomes.

In a particular application, the memory device can include control logic configured to predict different possible outcomes, for example predicting several possible outcomes and preparing for each, then use sensors, measurements, and monitoring to determine which outcome to activate at a particular time.

In some embodiments and/or applications of the memory devices depicted in FIGS. 5A, 5B, 6A, and 6B, memory accesses can be allocated according to sensed conditions. For example, the memory device 500, 600 can further include at least one sensor 512, 612 operable to detect an operating condition. The non-volatile memory array 502, 602 can include a plurality of memory blocks 508, 608. the control logic 504, 604 can be operable to monitor the operating condition, monitor memory accesses, analyze the monitored operating conditions and memory accesses, predict expected outcomes based on the monitored operating conditions and memory accesses, and allocate memory accesses to the plurality of memory blocks 508, 608 based on the predicted expected outcomes.

Figure 7A:
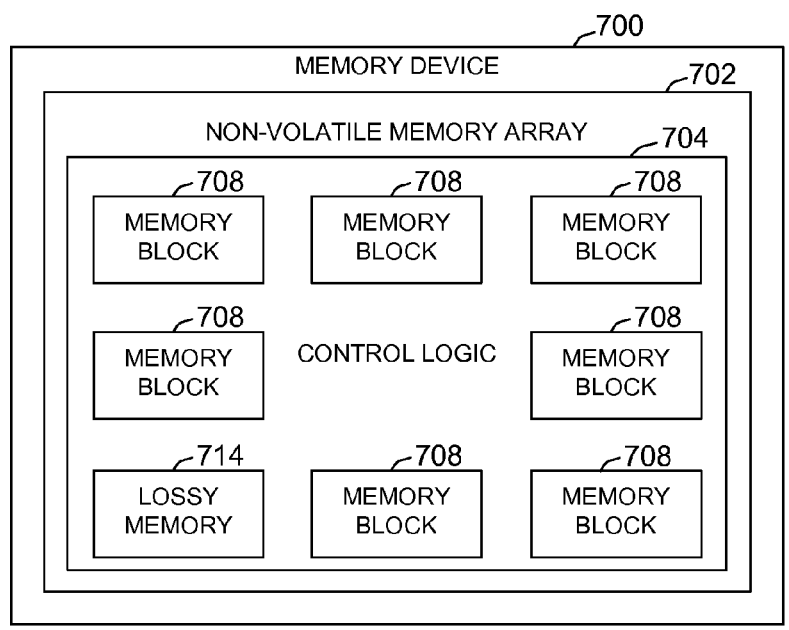
FIGS. 7A and 7B are respective top and side views of schematic block diagrams depicting embodiments of a memory device that is operable to perform intelligent memory computation using control logic that manages memory including at least a portion of the memory in the form of lossy memory.
Figure 7B:
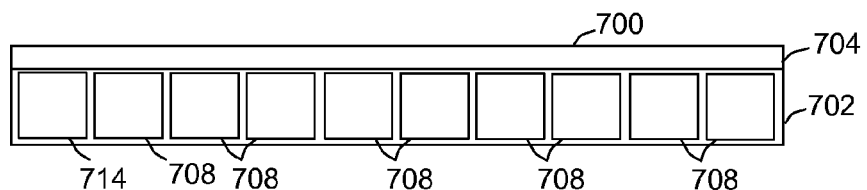

Referring to FIGS. 7A and 7B, respective top and side views of schematic block diagrams illustrate embodiments of a memory device that is operable to perform intelligent memory computation using control logic that manages memory including at least a portion of the memory in the form of lossy memory. In some embodiments and/or applications, the memory device 700 can include relatively inaccurate, inexpensive memory for contexts that allow lower reliability. Accordingly, the memory device 700 can have non-volatile memory array 702 which includes a plurality of memory blocks 708 including at least one memory block including lossy memory 714. The control logic 704 can be operable to monitor memory accesses, analyze the memory accesses to determine instructions and data indicative for storage in the at least one memory block including lossy memory 714, and selectively allocate memory accesses to the at least one memory block including lossy memory 714.

Figure 8A:
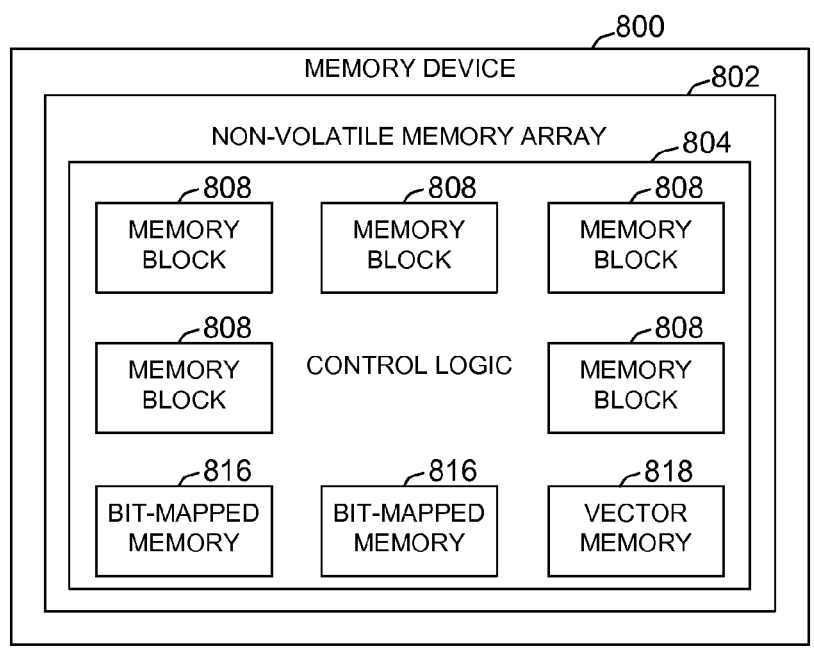
FIGS. 8A and 8B are respective top and side views of schematic block diagrams illustrating embodiments of a memory device that is operable to perform intelligent memory computation using control logic that manages memory including at least a portion of the memory in the form of bitmapped and vector memory.
Figure 8B:
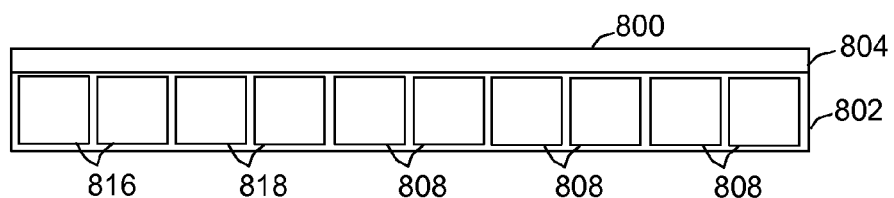

Referring to FIGS. 8A and 8B, respective top and side views of schematic block diagrams illustrate embodiments of a memory device that is operable to perform intelligent memory computation using control logic that manages memory including at least a portion of the memory in the form of bitmapped and vector memory. In various applications and/or embodiments, the memory device 800 can be arranged with non-volatile memory array 802 including a plurality of memory blocks 808. The control logic 804 can be operable to selectively access ones of the plurality of memory blocks 808 as bit-mapped memory 816 and access ones of the plurality of memory blocks 808 as vector memory 818.

For example, in some embodiments or applications a capability for the memory device to efficiently support both bit maps and vector graphics may be useful. Accordingly, the memory device can be configured so that the memory includes a portion that is bit-mapped and a portion that is vector memory. For example, part of the memory can be optimized for pictures and video (JPEG) and another portion optimized for more computational applications. An example of such that context that would benefit from both memory types is a mobile telephone with camera and/or video functionality.

Figure 9A:
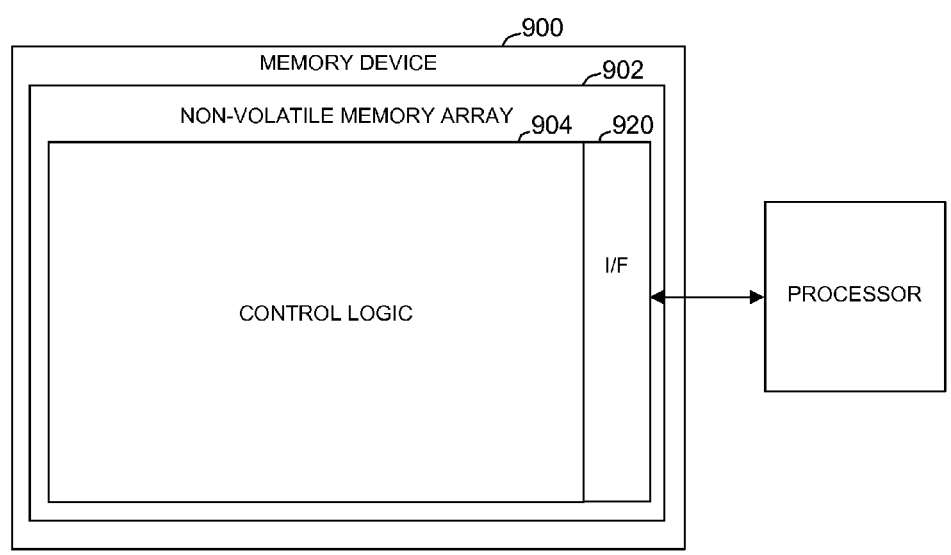
FIGS. 9A and 9B are respective top and side views of schematic block diagrams showing embodiments of a memory device that is operable to perform intelligent memory computation using control logic and includes a communication interface integrated to the control logic and memory.
Figure 9B:
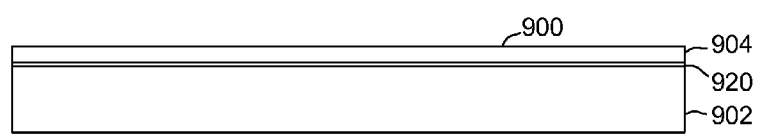

Referring to FIGS. 9A and 9B, respective top and side views of schematic block diagrams illustrate embodiments of a memory device that is operable to perform intelligent memory computation using control logic and includes a communication interface integrated to the control logic and memory. In further embodiments, the memory device 900 can further include a communication interface 920 coupled to the non-volatile memory array 902 and the control logic 904. The communication interface 920 can be operable to communicate external to the memory device 900. A memory device 900 that includes a communication interface 920 can communicate with other such devices or any type of device or system to enable multiple distributed devices to intercommunicate or to communicate with a network, for example in a cloud system. Thus, the memory device 900 can be widely distributed or even ubiquitous, to perform selected local processing regarding usage and environment, for example to enable history tracking, data pre-processing, and sharing to other devices or through the cloud.

In particular example embodiments, the memory device 900 can include a communication interface 920 in which optical silicon is integrated with the non-volatile memory array 902 and the control logic 904 to enable integrated circuits including the memory device 900 to intercommunicate. Usage of optical silicon can enable the memory device to avoid the bandwidth and bottleneck problems of a system bus. The optical silicon can enable data to pass more quickly from outside the memory device to the memory. The memory device can support a WiFi network which optimizes memory for a particular application. Optical silicon can be used to alleviate some of the bandwidth problem for reading high volumes of data, such as for moving photographs from a camera or camera-phone to a storage device such as a computer or library.

Figure 10A:
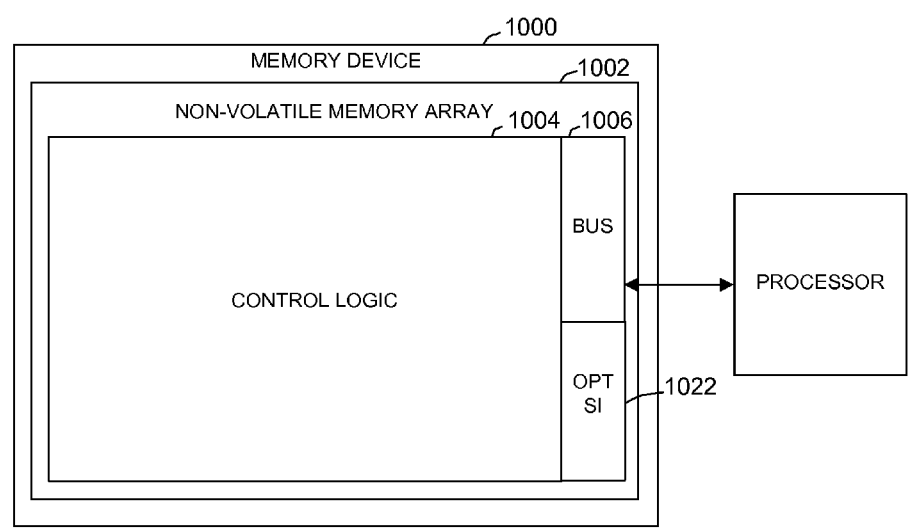
FIGS. 10A and 10B are respective top and side views of schematic block diagrams depicting embodiments of a memory device that is operable to perform intelligent memory computation using control logic and includes a optical silicon integrated to the control logic and memory for communication.
Figure 10B:
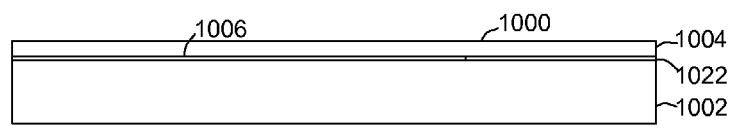

Referring to FIGS. 10A and 10B, respective top and side views of schematic block diagrams illustrate embodiments of a memory device that is operable to perform intelligent memory computation using control logic and includes a optical silicon integrated to the control logic and memory for communication. In a particular embodiment, the memory device 1000 can further include optical silicon 1022 which is operable to communicate optically, independently of a bus 1006 coupled to the memory device 1000 in which the control logic 1004 is operable to receive functions for tracking applications and processes independently of communication via bus 1006. For example, an optical sensor or silicon-based optical data connection can use silicon photonics and a hybrid silicon laser for communication between integrated circuit chips at distributed locations using plasmons (quanta of plasma oscillation) to communicate over relatively long distances, for example 2-3 inches on a narrow nano-wire coupler. The plasmon is a quasiparticle that results from quantization of plasma oscillations. Data can be received and converted using an optical antenna, a nano-cavity, or a quantum dot. The communication field can travel independently of a wired bus structure. For example, the memory device 1000 can receive information via the optical link, independently of the system bus connected to a processor, and the control logic 1004 can use the extra-bus information to perform management or housekeeping functions to track applications and/or processes (or, for example, bit correction) via data sent optically to the memory device 1000. The optical link thus enables low-bandwidth, back-channel communication, enabling formation of a memory that can communicate with large bursts of data for placement with optical accessibility.

The memory device can use the optical communication interface to substantially increase bandwidth. For example, dynamic random access memory (DRAM) cannot maintain synchrony over a distance of about four inches so that DRAM must be within four inches or less of a communicating processor, resulting in the memory bus becoming a data choke point, which can be relieved by the optical communication interface. Embodiments of the memory device with an optical interface can use the control logic to perform bus control operations using an optical clock and interferometry using interfering optical beams to accelerate data communication.

In some specific embodiments, the optical silicon interface can be operated by the control logic to increase data communication speed and reliability by constructing signals in the form of a sine-wave in a piece-wise manner, measuring segments above and below a base line and assigning digital values as 0 or 1 depending on wave position. Accordingly, formation of square wave signals is avoided, which attains benefits to heat dissipation, which is proportional to frequency squared.

Figure 11A:
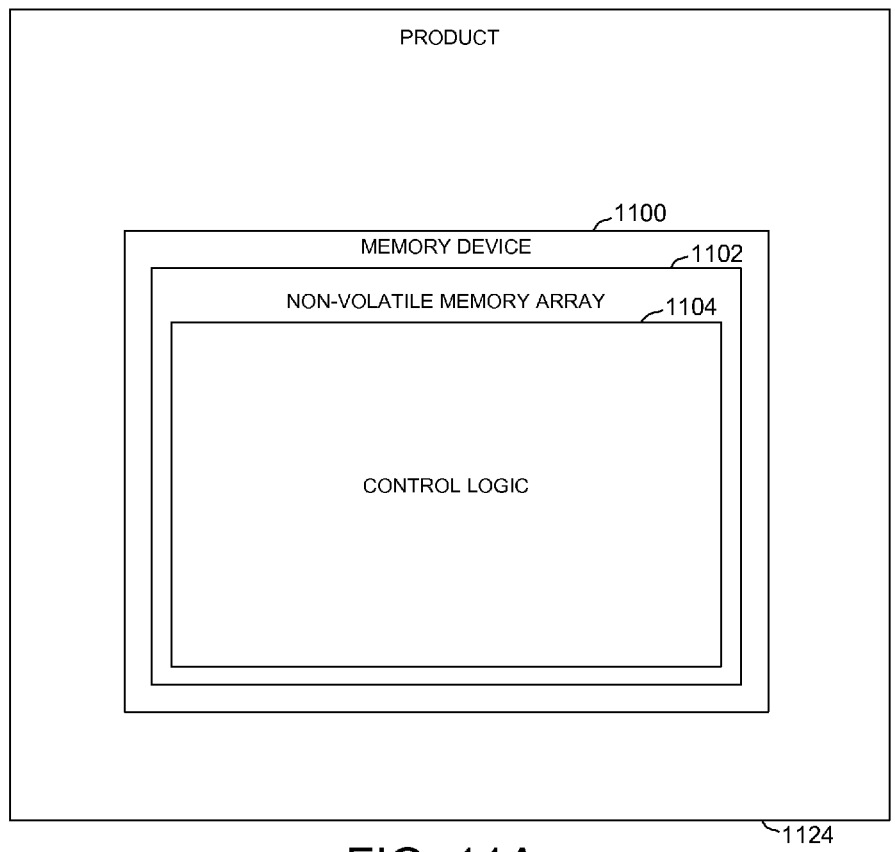
FIGS. 11A and 11B are respective top and side views of schematic block diagrams showing embodiments of a memory device that is operable to perform intelligent memory computation and is integrated into a product.
Figure 11B:
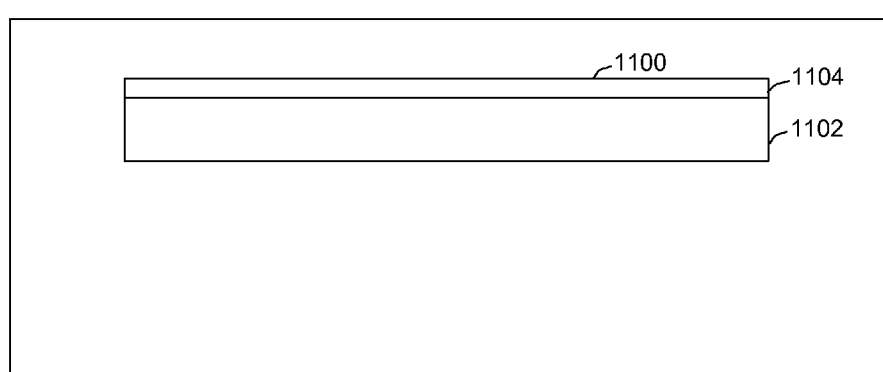

Referring to FIGS. 11A and 11B, respective top and side views of schematic block diagrams show embodiments of a memory device that is operable to perform intelligent memory computation and is integrated into a product. In some applications and/or embodiments, the memory device 1100 can include control logic 1104 that is operable to operate in combination with the non-volatile memory array 1102 to accumulate information about a product 1124. Custom versions of the memory device 1100, which includes processing functionality of the control logic 1104 combined with the non-volatile memory array 1102, can be integrated into any type of product 1124, for example electronic devices, such as mobile and cell phones, notebook computers, personal digital assistants, medical devices, medical diagnostic systems, digital cameras, audio players, digital televisions, automotive and transportation engine control units, USB flash personal discs, and global positioning systems.

In other applications and/or contexts, a memory system can be formed of printed non-volatile memory on polymer. In some arrangements, a printed non-volatile memory on polymer can form flexible memories. For example, a flexible memory can be integrated with processors for further integration into any type of product, even very simple products such as bottles, cans, or packaging materials. A non-volatile memory can be integrated in a system of any suitable product such as, for example, a door handle sleeve to detect and record who, what, when, and how anyone has touched the door handle. Such a system can be used to facilitate access or to provide security. In other examples, a non-volatile memory and processor in some applications with sensors and/or a communication interface can be used in a flexible device for a medical product such as bandages or implants. These products can be formed of dissolvable materials for temporary usage, for example in biocompatible electronic or medical devices that can dissolve in a body environment, or environmental monitors and consumer electronics that can dissolve in compost. Other applications of products incorporating non-volatile memory and processor can include sporting equipment, tags such as for rental cars, patient armbands in hospitals tied to sensors, smart glasses, or any type of device.

In further embodiments, instead of a flexible polymer, the non-volatile memory and processor can be formed of silicon that is sufficiently thin to become flexible and thus formed as an inexpensive printed circuit component. Flexible memory in ubiquitous items, using polymer memory or silicon memory, can enable various profitable services, for example in conjunction with medical devices, security services, automotive products, and the like.

In embodiments of the memory device with processing capability of control logic integrated in a distributed manner with non-volatile memory, the processing capability can be implemented with relatively low speed requirement to enable processors to be available in a ubiquitous manner. Accordingly, information can be acquired in a dispersed manner and intercommunicated over vast systems. Thus processors can be inexpensive and memory readily available for various consumer items. Custom versions of memory including non-volatile memory and RAM can be integrated into virtually any product, enabling widespread preprocessing in items such as door handles to determine who has accessed a location and how the access was made to allow any type of processing on the information.

Figure 12:
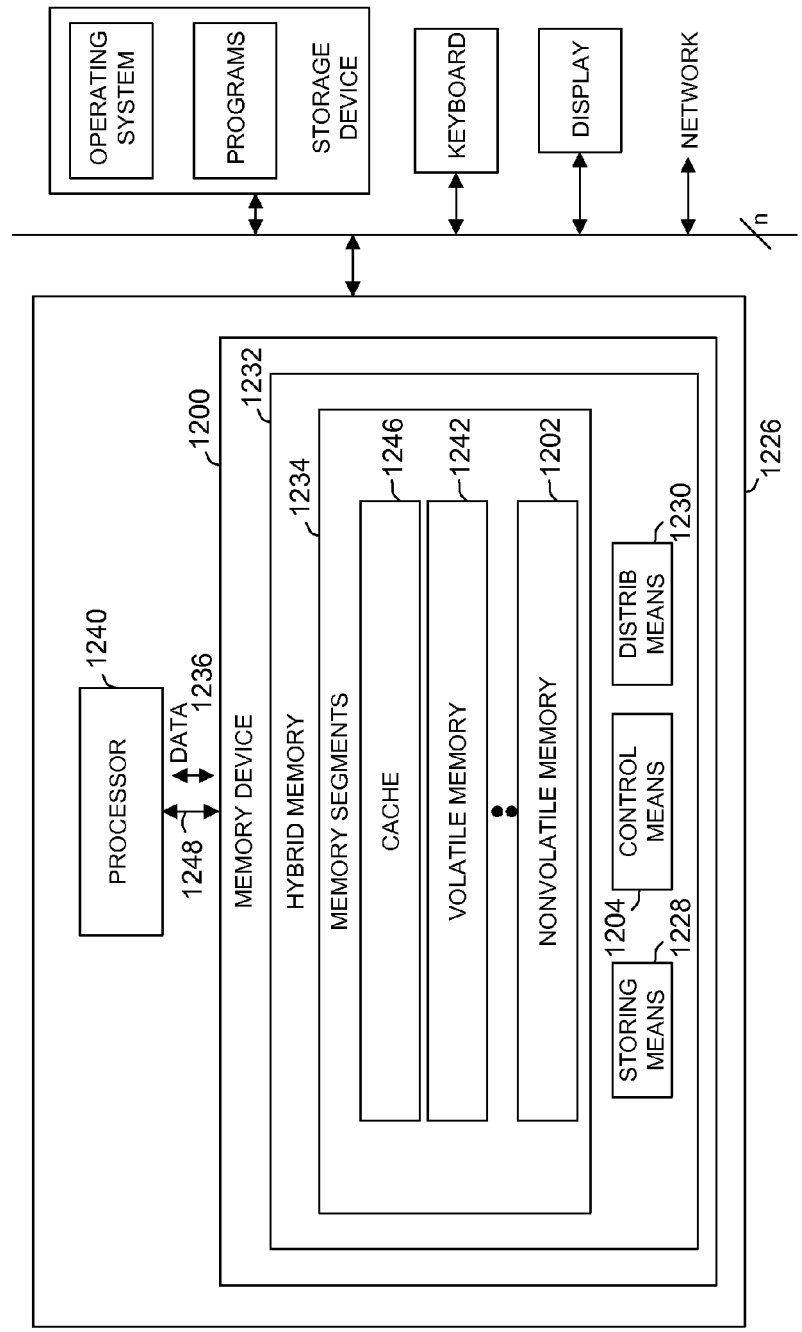
FIG. 12 is a schematic block diagram showing an embodiment of a memory device including means for storing information constituted to facilitate intelligent memory computation using control and/or computation logic integrated into memory.

Referring to FIG. 12, a schematic block diagram shows an embodiment of a memory device including means for storing information constituted to facilitate intelligent memory computation using control and/or computation logic integrated into memory. Accordingly, in further embodiments, as depicted in FIG. 12, a memory system 1226 includes means 1228 for storing information in a memory device 1200 including a non-volatile memory array 1202, means 1204 integrated with and distributed over the non-volatile memory array 1202 for controlling the means for storing information, and means 1230 for selectively distributing functionality across the non-volatile memory array 1202.

In an example embodiment, the memory device 1200 can include a hybrid memory 1232 that includes multiple memory segments 1234 characterized by a multiple different operating characteristics. The hybrid memory 1232 can store data 1236 communicated from a processor 1240. The memory device 1200 can further include logic 1238 for performing encryption operations on the data 1236 during transfers between the memory segments 1234.

In some embodiments, the memory device 1200 can be constituted wherein the logic 1238 operable to perform encryption operations is operable to perform encryption operations on the data 1236 during transfers between the processor 1240 and the multiple memory segments 1234.

The multiple memory segments 1234 can be arranged to include various types of memory with different characteristics and speeds, for example the multiple memory segments 1234 can comprise volatile main memory 1242, non-volatile main memory 1202, or a combination of memory types.

In particular embodiments, the multiple memory segments 1234 can constitute a volatile main memory 1242 and a non-volatile main memory 1202 wherein the volatile main memory 1242 has faster operating characteristics than the non-volatile main memory 1202. For example, the multiple memory segments 1234 can be formed in memory subsystem combining DRAM and a large amount of nonvolatile memory such as flash or phase change memory (PCM).

In some memory device 1200 embodiments, the multiple memory segments 1234 can include a cache 1246. In an example embodiment, DRAM can operate as a cache 1246 for the PCM or nonvolatile memory, facilitating channel encryption between the processor 1240 and the memory device 1200. The logic 1238 operable to perform encryption operations can decrypt the information encrypted by the processor 1240 and sent over the channel and store the decrypted information in the DRAM, then can use storage encryption when passing the information from the DRAM to the PCM or nonvolatile memory 1202.

Various embodiments of the memory device 1200 can be configured for channel encryption. For instance, the logic 1238 operable to perform encryption operations can function to encrypt data 1236 on a communication channel 1248 that communicates information between the processor 1240 and the hybrid memory 1232.

The memory device 1200 can be configured to perform one or more of several channel encryption operations in cooperation with a processor 1240. For instance, the logic 1238 operable to perform encryption operations can operable to decrypt information encrypted by the processor 1240. In some embodiments and/or conditions, the logic 1238 operable to perform encryption operations is operable to decrypt address and data information encrypted by the processor 1240 and store data at the address in the hybrid memory 1232. Similarly, the memory device 1200 can be configured wherein the logic 1238 operable to perform encryption operations is operable to partially decrypt information encrypted by the processor 1240.

Some embodiments of the memory device 1200 can include a random number generator, for example which can be closely associated to and integrated onto the memory device 1200 chip. Accordingly, the control logic 1204 can implement a pseudo-random number generator coupled to the hybrid memory 1232 and coupled to the logic 1238 operable to perform encryption operations. The pseudo-random number generator can be operable to generate numbers for usage in encrypting information.

The memory device 1200 can be configured to implement one or more of a variety of security schemes including channel encryption, storage encryption, RSA (Rivest, Shamir, Adleman) cryptography and key distribution, Public Key Infrastructure (PKI). Accordingly, the logic 1238 operable to perform encryption operations can be operable to perform stream encryption of communicated information wherein processor and memory sides are assigned a key. In another example functionality, the logic 1238 operable to perform encryption operations can be operable to encrypt information that is storage encrypted wherein the storage-encrypted information is encrypted by the processor 1240, stored in the hybrid memory 1232, accessed from the hybrid memory 1232, and decrypted by the processor 1240.

In a particular applications and/or arrangements, the security perimeter can be formed within the memory device 1200 and, for example, enclose the entire memory device 1200, between dynamic random access memory (DRAM) and the memory device 1200, between non-volatile random access memory (RAM) and the memory device 1200, or any other suitable position. The cryptographic and/or tamper-handling perimeter can further be generalized for positioning between a smaller amount of memory and a larger amount of memory in the memory device 1200. Some embodiments can include a cryptographic perimeter in the absence of a tamper-handling perimeter.

In some embodiments, the logic 1238 operable to perform encryption operations can be operable to perform time-varying encryption. For example, channel encryption assisted by the memory device 1200 can enable randomization of encrypted information wherein encrypted data is read back and encryption can be stripped off by the receiving processor 1240. The memory device 1200 with logic or other smart component can enable time-varying encryption. Data can be written to an address which, when read back, is different, but no information is lost since the reading processor 1240 or other reading device at the opposite side of the channel from the smart memory has sufficient intelligence capability to strip off the encryption.

Figure 13A:
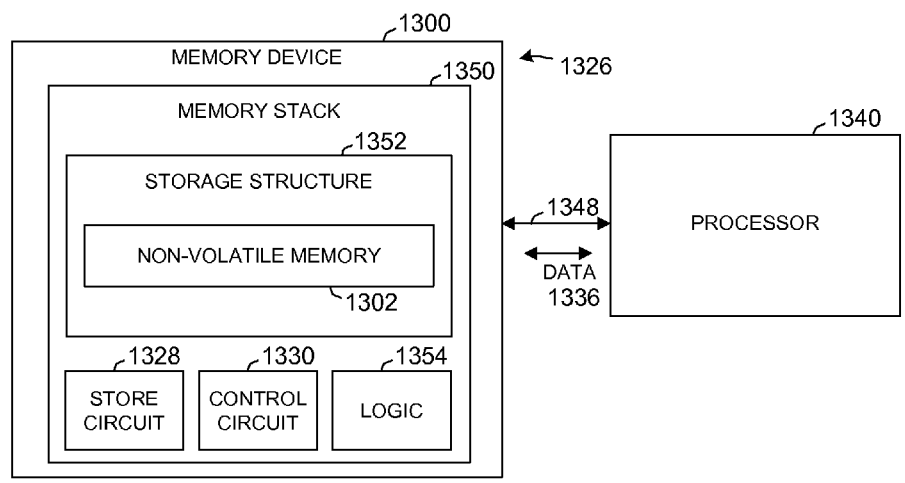
FIGS. 13A and 13B are a schematic block diagram and a side pictorial view illustrating an embodiment of circuitry for storing information to facilitate intelligent memory computation including control and/or computation logic integrated into memory.
Figure 13B:
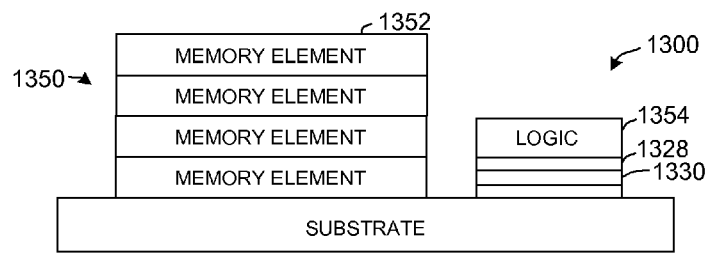

Referring to FIGS. 13A and 13B, a schematic block diagram and a side pictorial view illustrate an embodiment of circuitry for storing information to facilitate intelligent memory computation including control and/or computation logic integrated into memory. In other embodiments and/or applications, a system 1326 can be formed of circuitry. The system 1326 can comprise circuitry 1328 for storing information in a memory device 1300 including a non-volatile memory array 1302, circuitry 1304 integrated with and distributed over the non-volatile memory array 1302 for controlling the circuitry for storing information, and circuitry 1330 for selectively distributing functionality across the non-volatile memory array 1302.

Embodiments of a memory device 1300 that makes use of a memory stack 1350 to facilitate intelligent memory computation. In a particular example embodiment, intelligent memory computation can include security capabilities, including cryptographic security. In an illustrative embodiment, the memory device 1300 can comprise a memory stack 1350 operable to store data 1336 communicated from a processor 1340. The memory stack 1350 can comprise a storage structure 1352 and logic 1354 operable to perform encryption operations. The storage structure 1352 is operable to store data 1336 communicated via a communication channel 1348 from the processor 1340. The logic 1354 is operable to perform encryption operations on the data 1336 during transfers between the processor 1340 and the storage structure 1352.

The memory device 1300 can be constituted to facilitate channel encryption through operation of the logic 1354 operable to perform encryption operations. Accordingly, the logic 1354 operable to perform encryption operations can be operable to perform channel encryption operations on a communication channel 1348 that communicates information between the processor 1340 and the memory stack 1350. Channel encryption can improve performance and economy in various applications and conditions in comparison to expensive storage encryption. The logic 1354 operable to perform encryption operations can facilitate good memory encryption, for example between the processor 1340 and the memory stack 1350. An illustrative configuration can include a CPU that interacts with the memory stack 1350 comprising multiple DRAM chips and the logic 1354 operable to perform encryption operations integrated into a logic chip operable to perform strong channel encryption between the CPU and the memory stack 1350.

In various embodiments, the memory device 1300, the memory stack 1350, and the logic 1354 operable to perform encryption operations can be constituted to perform one or more of several security operations. For example, the logic 1354 operable to perform encryption operations is operable to decrypt information encrypted by the processor 1340. Similarly, the logic 1354 operable to perform encryption operations is operable to partially decrypt information encrypted by the processor 1340. The logic 1354 can also be operable to perform encryption operations is operable to perform stream encryption of information communicated on a communication channel 1348 wherein processor and memory sides of the communication channel 1348 are assigned a key. In an embodiment or circumstances where security can be best attained by using a combination of storage encryption and channel encryption, the logic 1354 operable to perform encryption operations is operable to perform channel encryption operations on a communication channel 1348 for information that is storage encrypted wherein the storage-encrypted information is encrypted by the processor 1340, stored in the memory stack 1350, accessed from the memory stack 1350, and decrypted by the processor 1340. The logic 1354 operable to perform encryption operations can also be operable to perform time-varying encryption.

Information can be stored in the memory stack 1350 unencrypted or the logic 1354 can encrypt the data for storage. Thus, channel encryption can be performed between the CPU and a logic chip, enabling cryptographic security without requiring storage encryption of data stored in the logic chip.

Referring to FIGS. 14A through 14S and FIGS. 15A through 15I, schematic flow charts illustrate several embodiments and/or aspects of a method of operating a memory device for storing information to facilitate intelligent memory computation using control and/or computation logic integrated into memory. The illustrative method 1400, depicted in FIG. 14A, of operating a memory device can include providing 1401 a memory device including a non-volatile memory array and control logic integrated with and distributed over the non-volatile memory array. The method can further include operating 1402 the control logic operable to selectively distribute functionality across the non-volatile memory array.

Figure 14C:
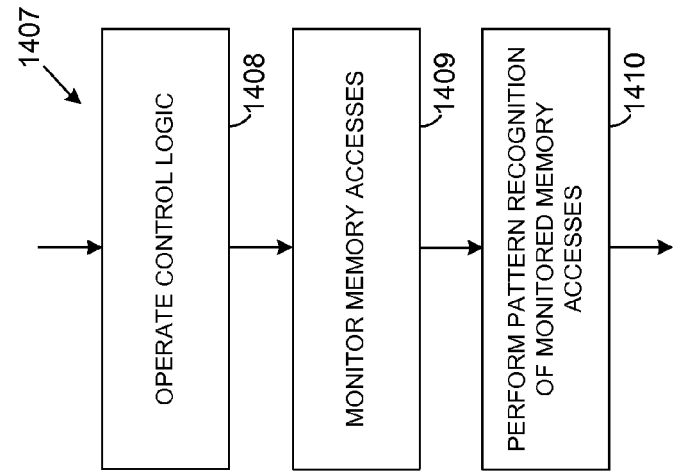
Figure 14B:
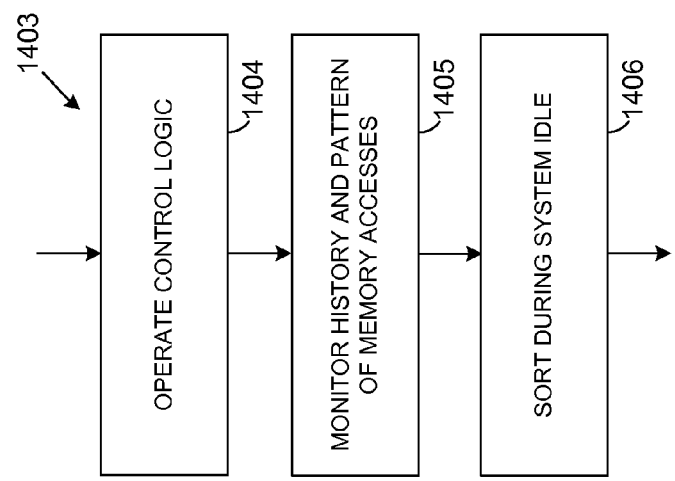
Figure 14A:
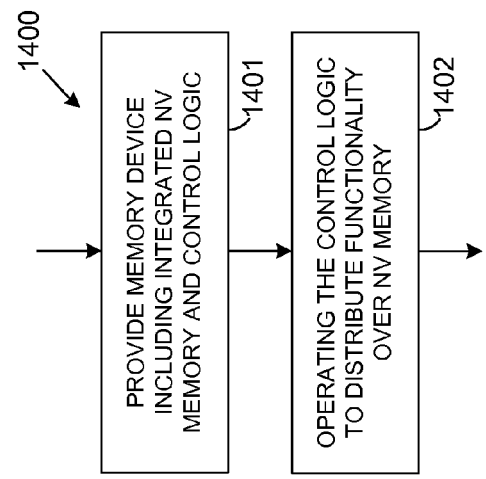

Referring to FIG. 14B, in some embodiments, a method 1403 of operating the memory device can further include operating 1404 the control logic including monitoring 1405 a history and pattern of memory accesses, and sorting 1406 during system idle.

In further embodiments and/or applications, as shown in FIG. 14C, the method 1407 of operating the memory device can further include operating 1408 the control logic including monitoring 1409 memory accesses, and performing 1410 pattern recognition of the monitored memory accesses.

In various embodiments, as depicted in FIG. 14D, the method 1411 of operating the memory device can further include operating 1412 the control logic including monitoring 1413 memory accesses, determining 1414 statistics on type and number of instructions of the monitored memory accesses, and predicting 1415 a sequence of instructions and data using the determined statistics.

Referring to FIG. 14E, in some embodiments, a method 1416 of operating the memory device can further include operating 1417 the control logic including monitoring 1418 memory accesses, and detecting 1419 a pattern of instructions and data from the monitored memory accesses. Operating the control logic can further include predicting 1420 expected instructions and data from the detected pattern of instructions and data, and preprocessing 1421 the predicted expected instructions.

As shown in FIG. 14F, in various embodiments and/or applications, the method 1422 of operating the memory device can further include operating 1423 the control logic including performing 1424 selective memory access and management operations independently of signals external to the memory device.

In some embodiments, illustrated in FIG. 14G, the method 1425 of operating the memory device can further include operating 1426 the control logic including monitoring 1427 operating characteristics of the memory device, analyzing 1428 the monitored operating characteristics, detecting 1429 a precursor to a memory failure based on the analysis, and allocating 1430 memory accesses based on the detected precursor.

In various embodiments and/or applications, as shown in FIG. 14H, the method 1431 of operating the memory device can further include integrating 1432 a plurality of memory elements in the non-volatile memory array, and operating 1433 the control logic. Operating 1433 the control logic can include monitoring 1434 writes to the plurality of memory elements of the non-volatile memory array, and allocating 1435 writes to the memory elements based on results of the monitoring.

Referring to FIG. 14I, selected embodiments of the method 1436 of operating the memory device can further include integrating 1437 a plurality of memory elements in the non-volatile memory array, and operating 1438 the control logic. Operating 1438 the control logic can include monitoring 1439 writes to the plurality of memory elements of the non-volatile memory array, and distributing 1440 writes across the plurality of memory elements based on results of the monitoring.

Figure 14L:
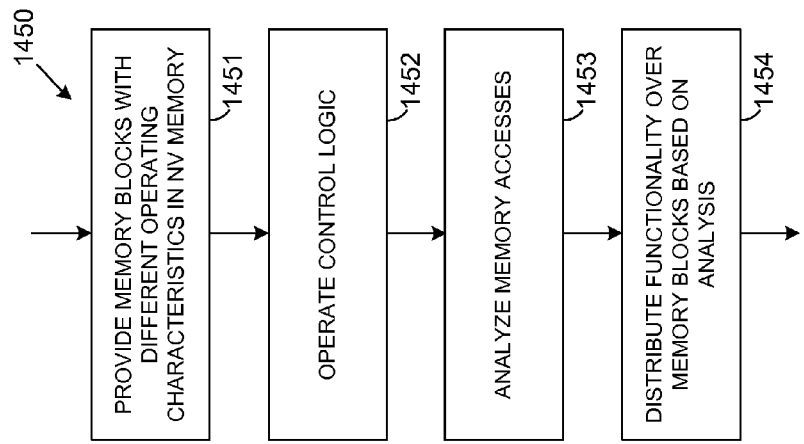
Figure 14K:
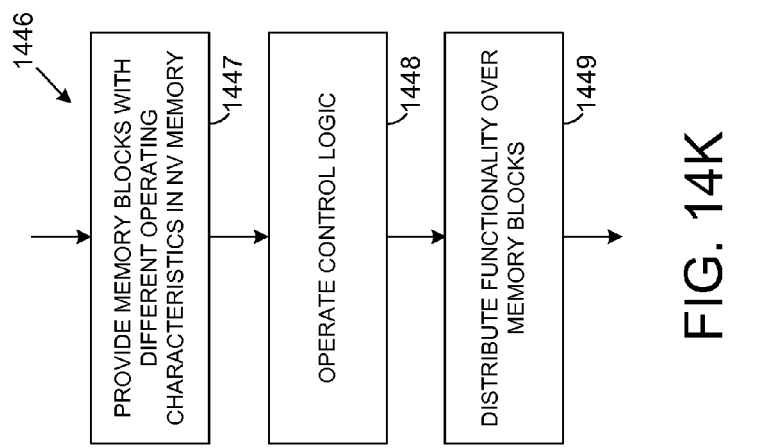
Figure 14J:
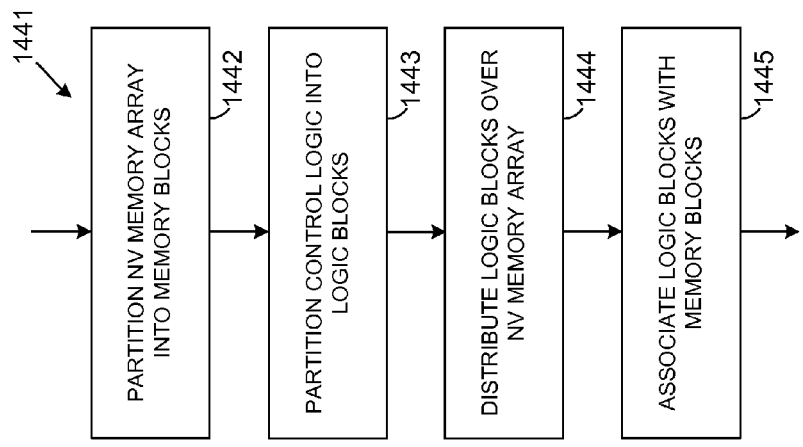

As illustrated in FIG. 14J, some embodiments of the method 1441 of operating the memory device can further include partitioning 1442 the non-volatile memory array into a plurality of memory blocks, partitioning 1443 the control logic into a plurality of command logic blocks, and spatially distributing 1444 the plurality of command logic blocks over the non-volatile memory array. One or more of the plurality of command logic blocks can be associated 1445 with one or more of the plurality of memory blocks.

As shown in FIG. 14K, an embodiment of a method 1446 of operating a memory device can include providing 1447 a plurality of memory blocks characterized by a plurality of different operating characteristics in the non-volatile memory array, and operating 1448 the control logic including selectively distributing 1449 functionality over the plurality of memory blocks.

Referring to FIG. 14L, in some embodiments, a method 1450 of operating the memory device can further include providing 1451 a plurality of memory blocks characterized by a plurality of different operating characteristics in the non-volatile memory array, and operating 1452 the control logic including analyzing 1453 memory accesses, and selectively distributing 1454 functionality over the plurality of memory blocks based on the analysis.

In further embodiments and/or applications, as shown in FIG. 14M, the method 1455 of operating the memory device can further include providing 1456 a plurality of memory blocks characterized by a plurality of different operating characteristics in the non-volatile memory array, and operating 1457 the control logic. Operating the control logic 1457 can include analyzing 1458 memory accesses, determining 1459 application constraints based on the analysis, and selectively distributing 1460 functionality over the plurality of memory blocks based on the determined application constraints.

In various embodiments, as depicted in FIG. 14N, the method 1461 of operating the memory device can further include providing 1462 a plurality of memory blocks characterized by a plurality of different Quality-of-Service (QoS) ratings, and operating 1463 the control logic. Operating 1463 the control logic can include analyzing 1464 memory accesses, determining 1465 priority of performance based on the analysis, and selectively distributing 1466 functionality over the plurality of memory blocks based on the determined priority of performance.

Referring to FIG. 14O, in some embodiments, a method 1467 of operating the memory device can further include providing 1468 a plurality of memory blocks in the non-volatile memory array, and operating 1469 the control logic. Operating 1469 the control logic can include analyzing 1470 memory accesses, performing 1471 error detection based on the analysis, and characterizing 1472 Quality-of-Service (QoS) ratings of the plurality of memory blocks based on the performed error detection.

Figures 14P, 14Q:
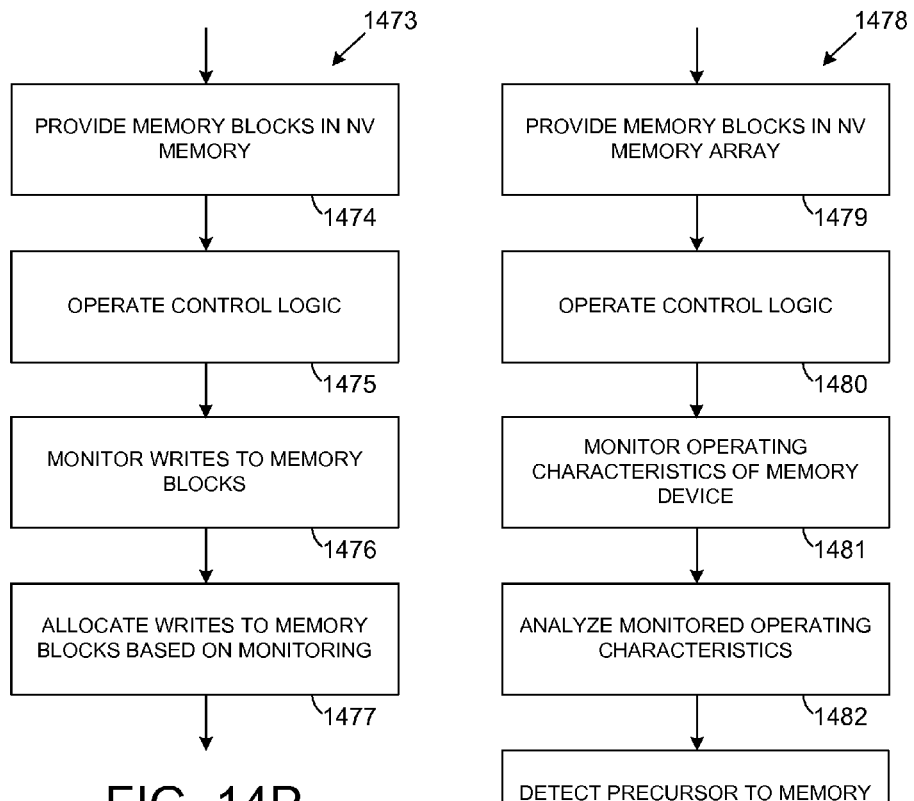

As shown in FIG. 14P, in various embodiments and/or applications, the method 1473 of operating the memory device can further include providing 1474 a plurality of memory blocks in the non-volatile memory array, and operating 1475 the control logic. Operating 1475 the control logic can include monitoring 1476 writes to the plurality of memory blocks of the non-volatile memory array, and allocating 1477 writes to the memory blocks based on results of the monitoring.

In some embodiments, illustrated in FIG. 14Q, the method 1478 of operating the memory device can further include providing 1479 a plurality of memory blocks in the non-volatile memory array, and operating 1480 the control logic. Operating 1480 the control logic can include monitoring 1481 operating characteristics of the memory device, analyzing 1482 the monitored operating characteristics, detecting 1483 a precursor to a memory failure based on the analysis, and allocating 1484 memory accesses among the plurality of memory blocks based on the detected precursor.

Figures 14R, 14S:
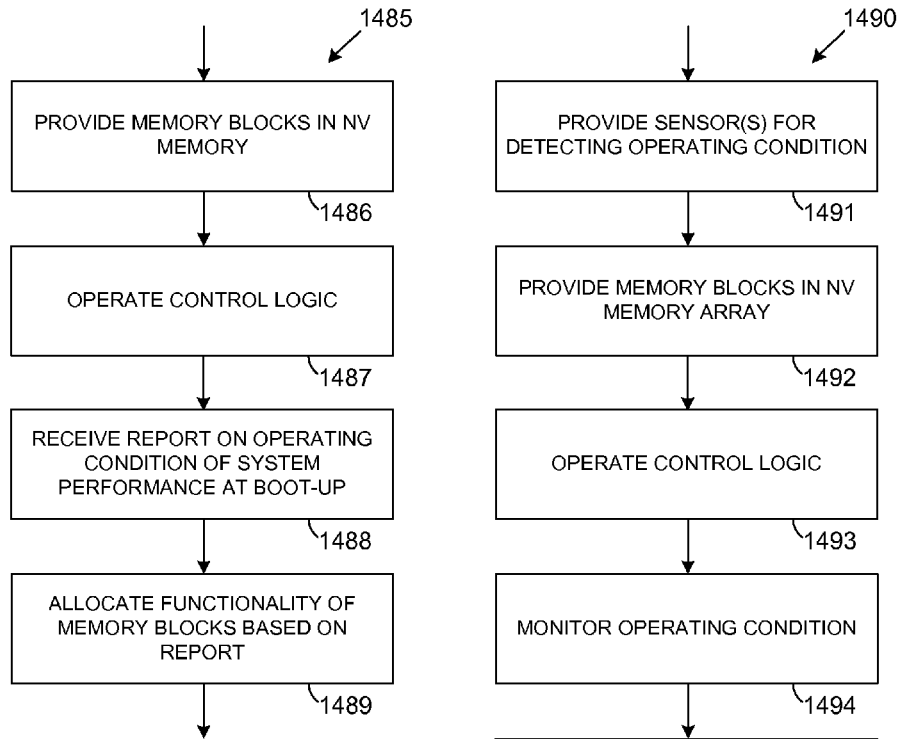

In various embodiments and/or applications, as shown in FIG. 14R, the method 1485 of operating the memory device can further include providing 1486 a plurality of memory blocks in the non-volatile memory array, and operating 1487 the control logic. Operating 1487 the control logic can include receiving 1488 a report on an operating condition of system performance at system bootstrap loading, and allocating 1489 functionality among the plurality of memory blocks based on the report.

Referring to FIG. 14S, selected embodiments of the method 1490 of operating the memory device can further include providing 1491 at least one sensor operable to detect an operating condition, providing 1492 a plurality of memory blocks in the non-volatile memory array, and operating 1493 the control logic. Operating 1493 the control logic can include monitoring 1494 the operating condition, analyzing 1495 the monitored operating condition, detecting 1496 a precursor to a memory failure based on the analysis. and allocating 1497 memory accesses among the plurality of memory blocks based on the detected precursor.

Figures 15A, 15B:
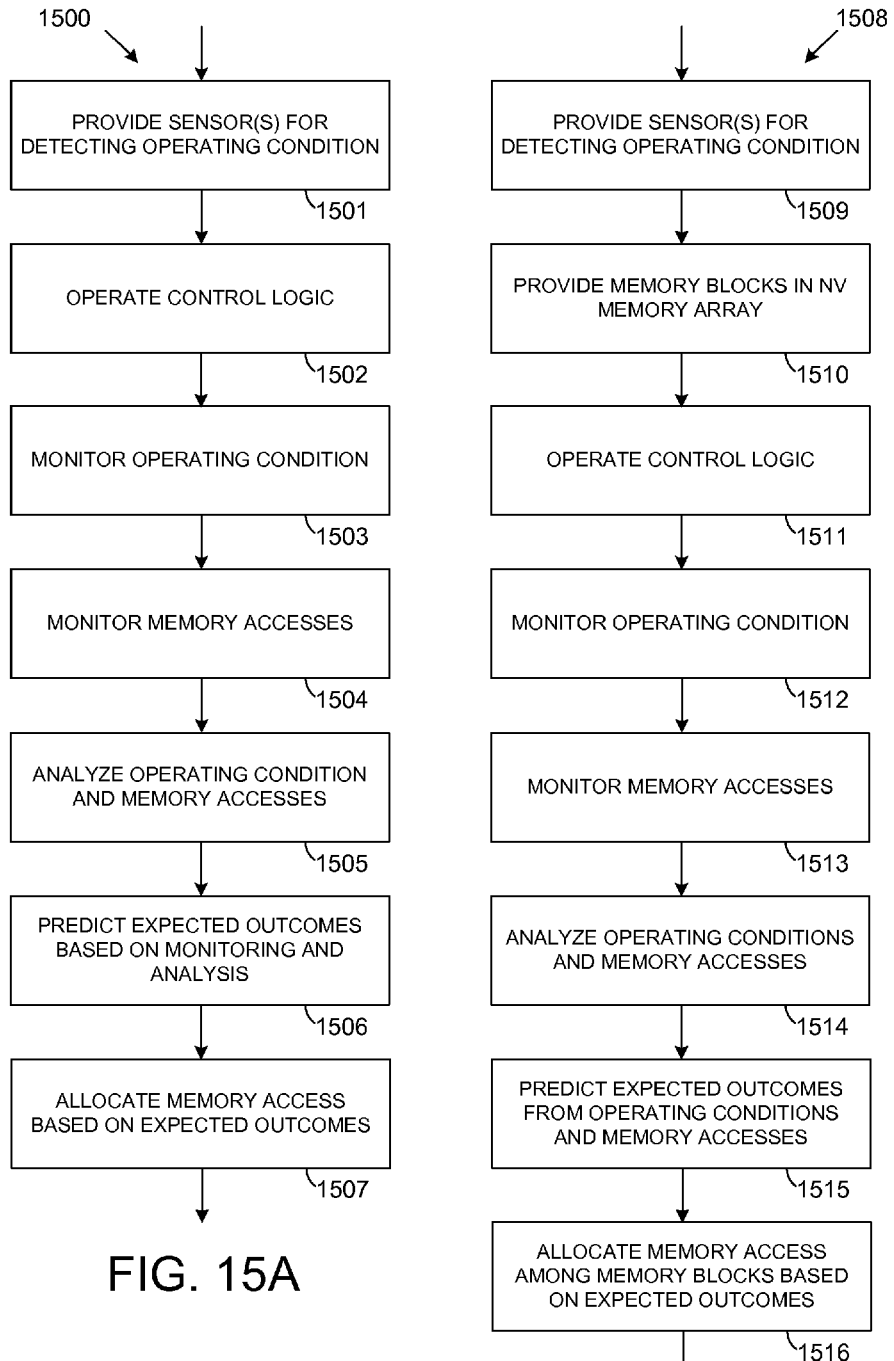

As illustrated in FIG. 15A, some embodiments of the method 1500 of operating the memory device can further include providing 1501 at least one sensor operable to detect an operating condition, and operating 1502 the control logic. Operating 1502 the control logic can include monitoring 1503 the operating condition, monitoring 1504 memory accesses, analyzing 1505 the monitored operating conditions and memory accesses, predicting 1506 expected outcomes based on the monitored operating conditions and memory accesses, and allocating 1507 memory accesses based on the predicted expected outcomes.

As shown in FIG. 15B, an embodiment of a method 1508 of operating a memory device can include providing 1509 at least one sensor operable to detect an operating condition, providing 1510 a plurality of memory blocks in the non-volatile memory array, and operating 1511 the control logic. Operating 1511 the control logic can include monitoring 1512 the operating condition, monitoring 1513 memory accesses, and analyzing 1514 the monitored operating conditions and memory accesses. Operating 1511 the control logic can further include predicting 1515 expected outcomes based on the monitored operating conditions and memory accesses, and allocating 1516 memory accesses to the plurality of memory blocks based on the predicted expected outcomes.

Figures 15C, 15D:
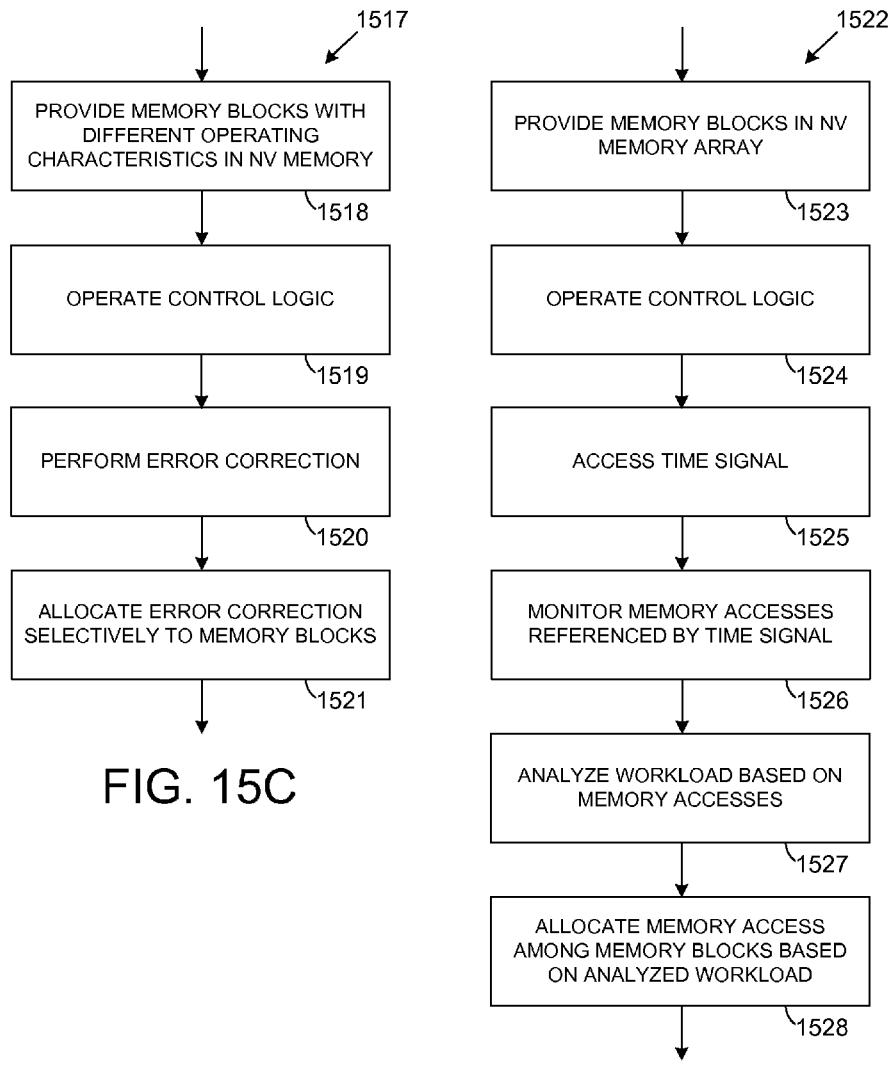

Referring to FIG. 15C, in some embodiments, a method 1517 of operating the memory device can further include providing 1518 a plurality of memory blocks characterized by a plurality of different operating characteristics in the non-volatile memory array, and operating 1519 the control logic including performing 1520 a plurality of error correction algorithms, and selectively allocating 1521 one or more of the plurality of error correction algorithms to ones of the plurality of memory blocks.

In further embodiments and/or applications, as shown in FIG. 15D, the method 1522 of operating the memory device can further include providing 1523 a plurality of memory blocks in the non-volatile memory array, and operating 1524 the control logic. Operating 1524 the control logic can include accessing 1525 a time signal, monitoring 1526 memory accesses referenced by the time signal, analyzing 1527 workload based on the monitored memory accesses, and allocating 1528 memory accesses among the plurality of memory blocks based on the analyzed workload.

In various embodiments, as depicted in FIG. 15E, the method 1529 of operating the memory device can further include providing 1530 a plurality of memory blocks including at least one memory block including lossy memory in the non-volatile memory array, and operating 1531 the control logic. Operating 1531 the control logic can include monitoring 1532 memory accesses, analyzing 1533 the memory accesses to determine instructions and data indicative for storage in the at least one memory block including lossy memory, and selectively allocating 1534 memory accesses to the at least one memory block including lossy memory.

Referring to FIG. 15F, in some embodiments, a method 1535 of operating the memory device can further include providing 1536 a plurality of memory blocks in the non-volatile memory array, and operating 1537 the control logic. Operating 1537 the control logic can include selectively accessing 1538 ones of the plurality of memory blocks as bit-mapped memory, and selectively accessing 1539 ones of the plurality of memory blocks as vector memory.

As shown in FIG. 15G, in various embodiments and/or applications, the method 1540 of operating the memory device can further include providing 1541 a communication interface coupled to the non-volatile memory array and the control logic, and operating 1542 the communication interface including communicating external to the memory device.

In some embodiments, illustrated in FIG. 15H, the method 1543 of operating the memory device can further include providing 1544 optical silicon for communicating optically, independently of a bus coupled to the memory device, and operating 1545 the control logic including receiving 1546 functions for tracking applications, and processing 1547 independently of communication via a bus.

In various embodiments and/or applications, as shown in FIG. 15I, the method 1548 of operating the memory device can further include operating 1549 the control logic in combination with the non-volatile memory array including accumulating 1550 information about a product.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those having ordinary skill in the art will recognize that optical aspects of implementations will typically employ optically-oriented hardware, software, and or firmware.

In some implementations described herein, logic and similar implementations may include software or other control structures suitable to operation. Electronic circuitry, for example, may manifest one or more paths of electrical current constructed and arranged to implement various logic functions as described herein. In some implementations, one or more media are configured to bear a device-detectable implementation if such media hold or transmit a special-purpose device instruction set operable to perform as described herein. In some variants, for example, this may manifest as an update or other modification of existing software or firmware, or of gate arrays or other programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or otherwise invoking circuitry for enabling, triggering, coordinating, requesting, or otherwise causing one or more occurrences of any functional operations described above. In some variants, operational or other logical descriptions herein may be expressed directly as source code and compiled or otherwise invoked as an executable instruction sequence. In some contexts, for example, C++ or other code sequences can be compiled directly or otherwise implemented in high-level descriptor languages (e.g., a logic-synthesizable language, a hardware description language, a hardware design simulation, and/or other such similar mode(s) of expression). Alternatively or additionally, some or all of the logical expression may be manifested as a Verilog-type hardware description or other circuitry model before physical implementation in hardware, especially for basic operations or timing-critical applications. Those having ordinary skill in the art will recognize how to obtain, configure, and optimize suitable transmission or computational elements, material supplies, actuators, or other common structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those having ordinary skill in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those having ordinary skill in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In a general sense, those having ordinary skill in the art will recognize that the various embodiments described herein can be implemented, individually and/or collectively, by various types of electro-mechanical systems having a wide range of electrical components such as hardware, software, firmware, and/or virtually any combination thereof; and a wide range of components that may impart mechanical force or motion such as rigid bodies, spring or torsional bodies, hydraulics, electromagnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, communications switch, optical-electrical equipment, etc.), and/or any non-electrical analog thereto, such as optical or other analogs. Those having ordinary skill in the art will also appreciate that examples of electro-mechanical systems include but are not limited to a variety of consumer electronics systems, medical devices, as well as other systems such as motorized transport systems, factory automation systems, security systems, and/or communication/computing systems. Those having ordinary skill in the art will recognize that electro-mechanical as used herein is not necessarily limited to a system that has both electrical and mechanical actuation except as context may dictate otherwise.

In a general sense, those having ordinary skill in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those having ordinary skill in the art will recognize that at least a portion of the devices and/or processes described herein can be integrated into an image processing system. Those having skill in the art will recognize that a typical image processing system generally includes one or more of a system unit housing, a video display device, memory such as volatile or non-volatile memory, processors such as microprocessors or digital signal processors, computational entities such as operating systems, drivers, applications programs, one or more interaction devices (e.g., a touch pad, a touch screen, an antenna, etc.), control systems including feedback loops and control motors (e.g., feedback for sensing lens position and/or velocity; control motors for moving/distorting lenses to give desired focuses). An image processing system may be implemented utilizing suitable commercially available components, such as those typically found in digital still systems and/or digital motion systems.

Those having ordinary skill in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems. Those having ordinary skill in the art will recognize that at least a portion of the devices and/or processes described herein can be integrated into a mote system. Those having skill in the art will recognize that a typical mote system generally includes one or more memories such as volatile or non-volatile memories, processors such as microprocessors or digital signal processors, computational entities such as operating systems, user interfaces, drivers, sensors, actuators, applications programs, one or more interaction devices (e.g., an antenna USB ports, acoustic ports, etc.), control systems including feedback loops and control motors (e.g., feedback for sensing or estimating position and/or velocity; control motors for moving and/or adjusting components and/or quantities). A mote system may be implemented utilizing suitable components, such as those found in mote computing/communication systems. Specific examples of such components entail such as Intel Corporation's and/or Crossbow Corporation's mote components and supporting hardware, software, and/or firmware.

Those having ordinary skill in the art will recognize that it is common within the art to implement devices and/or processes and/or systems, and thereafter use engineering and/or other practices to integrate such implemented devices and/or processes and/or systems into more comprehensive devices and/or processes and/or systems. That is, at least a portion of the devices and/or processes and/or systems described herein can be integrated into other devices and/or processes and/or systems via a reasonable amount of experimentation. Those having skill in the art will recognize that examples of such other devices and/or processes and/or systems might include—as appropriate to context and application—all or part of devices and/or processes and/or systems of (a) an air conveyance (e.g., an airplane, rocket, helicopter, etc.), (b) a ground conveyance (e.g., a car, truck, locomotive, tank, armored personnel carrier, etc.), (c) a building (e.g., a home, warehouse, office, etc.), (d) an appliance (e.g., a refrigerator, a washing machine, a dryer, etc.), (e) a communications system (e.g., a networked system, a telephone system, a Voice over IP system, etc.), (f) a business entity (e.g., an Internet Service Provider (ISP) entity such as Comcast Cable, Qwest, Southwestern Bell, etc.), or (g) a wired/wireless services entity (e.g., Sprint, Cingular, Nextel, etc.), etc.

In certain cases, use of a system or method may occur in a territory even if components are located outside the territory. For example, in a distributed computing context, use of a distributed computing system may occur in a territory even though parts of the system may be located outside of the territory (e.g., relay, server, processor, signal-bearing medium, transmitting computer, receiving computer, etc. located outside the territory). A sale of a system or method may likewise occur in a territory even if components of the system or method are located and/or used outside the territory. Further, implementation of at least part of a system for performing a method in one territory does not preclude use of the system in another territory.

One of ordinary skill in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Those having ordinary skill in the art will appreciate that a user may be representative of a human user, a robotic user (e.g., computational entity), and/or substantially any combination thereof (e.g., a user may be assisted by one or more robotic agents) unless context dictates otherwise.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those having ordinary skill in the art will recognize that "configured to" can generally encompass active-state components and/or inactive-state components and/or standby-state components, unless context requires otherwise. While particular aspects of the present subject matter described herein have been shown and described, it will be apparent to those having ordinary skill in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those having ordinary skill in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms. For example, the phrase "A or B" will be typically understood to include the possibilities of "A" or "B" or "A and B."

With respect to the appended claims, those having ordinary skill in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. A memory device comprising:
    a memory integrated circuit chip including at least:
        a non-volatile memory array including one or more layers of discrete storage cells extending laterally across the memory integrated circuit chip; and
        control logic including one or more logic layers integrated in combination with the one or more layers of discrete storage cells and distributed extending laterally over the non-volatile memory array, the control logic operable to selectively distribute information processing functionality across the non-volatile memory array.

2. The memory device according to claim 1 further comprising:

a bus integrated with the control logic and the non-volatile memory array on the memory integrated circuit chip.

3. The memory device according to claim 1 wherein:
the control logic operable to selectively distribute information processing functionality across the non-volatile memory array is operable to monitor a history and pattern of memory accesses in the non-volatile memory array and perform sorting of information stored in the non-volatile memory array during system idle based at least in part on the history and pattern of the memory accesses.

4. The memory device according to claim 1 wherein:
the control logic operable to selectively distribute information processing functionality across the non-volatile memory array is operable to monitor memory accesses and perform pattern recognition of the monitored memory accesses.

5. The memory device according to claim 1 wherein:
the control logic operable to selectively distribute information processing functionality across the non-volatile memory array is operable to monitor memory accesses, determine statistics on type and number of instructions of the monitored memory accesses, and predict a sequence of instructions and data at least in part by using the determined statistics.

6. The memory device according to claim 1 wherein:
the control logic operable to selectively distribute information processing functionality across the non-volatile memory array is operable to monitor memory accesses, detect a pattern of instructions and data from the monitored memory accesses, predict expected instructions and data from the detected pattern of instructions and data, and preprocessing the predicted expected instructions.

7. The memory device according to claim 1 wherein:
the control logic operable to selectively distribute information processing functionality across the non-volatile memory array is operable to perform selective memory access and management operations independently of signals external to the memory device.

8. The memory device according to claim 1 wherein:
the control logic operable to selectively distribute information processing functionality across the non-volatile memory array is operable to monitor operating characteristics of the memory device, analyze the monitored operating characteristics, detect a precursor to a memory failure based on the analysis, and allocate memory accesses based at least in part on the detected precursor.

9. The memory device according to claim 1 wherein:
the non-volatile memory array includes a plurality of memory elements; and
the control logic operable to selectively distribute information processing functionality across the non-volatile memory array is operable to monitor writes to the plurality of memory elements of the non-volatile memory array and allocate writes to the plurality of memory elements based at least in part on results of the monitoring.

10. The memory device according to claim 1 wherein:
the non-volatile memory array includes a plurality of memory elements; and
the control logic operable to selectively distribute information processing functionality across the non-volatile memory array is operable to monitor writes to the plurality of memory elements of the non-volatile memory array and distribute writes across the plurality of memory elements based at least in part on results of the monitoring.

11. The memory device according to claim 1 wherein:
the non-volatile memory array is partitioned into a plurality of memory blocks including one or more layers of discrete storage cells extending laterally across the memory integrated circuit chip; and
the control logic operable to selectively distribute information processing functionality across the non-volatile memory array is partitioned into a plurality of command logic blocks spatially distributed over the non-volatile memory array wherein one or more of the plurality of command logic blocks are associated with one or more of the plurality of memory blocks.

12. The memory device according to claim 1 wherein:
the non-volatile memory array includes a plurality of memory blocks characterized by a plurality of different operating characteristics, the plurality of memory blocks including one or more layers of discrete storage cells extending laterally across the memory integrated circuit chip; and
the control logic operable to selectively distribute information processing functionality across the non-volatile memory array is operable to selectively distribute functionality over the plurality of memory blocks.

13. The memory device according to claim 1 wherein:
the non-volatile memory array includes a plurality of memory blocks characterized by a plurality of different operating characteristics, the plurality of memory blocks including one or more layers of discrete storage cells extending laterally across the memory integrated circuit chip; and
the control logic operable to selectively distribute information processing functionality across the non-volatile memory array is operable to analyze memory accesses and selectively distribute functionality over the plurality of memory blocks based on the analysis.

14. The memory device according to claim 1 wherein:
the non-volatile memory array includes a plurality of memory blocks characterized by a plurality of different operating characteristics, the plurality of memory blocks including one or more layers of discrete storage cells extending laterally across the memory integrated circuit chip; and
the control logic operable to selectively distribute information processing functionality across the non-volatile memory array is operable to analyze memory accesses, determine application constraints based on the analysis, and selectively distribute functionality over the plurality of memory blocks based at least in part on the determined application constraints.

15. The memory device according to claim 1 wherein:
the non-volatile memory array includes a plurality of memory blocks characterized by a plurality of different Quality-of-Service (QoS) ratings, the plurality of memory blocks including one or more layers of discrete storage cells extending laterally across the memory integrated circuit chip; and
the control logic operable to selectively distribute information processing functionality across the non-volatile memory array is operable to analyze memory accesses, determine priority of performance based on the analysis, and selectively distribute functionality over the plurality of memory blocks based at least in part on the determined priority of performance.

16. The memory device according to claim 1 wherein:
the non-volatile memory array includes a plurality of memory blocks characterized by a plurality of different Quality-of-Service (QoS) ratings, the plurality of memory blocks including one or more layers of discrete storage cells extending laterally across the memory integrated circuit chip; and
the control logic operable to selectively distribute information processing functionality across the non-volatile memory array is operable to analyze memory accesses, perform error detection based on the analysis, and characterize Quality-of-Service (QoS) ratings of the plurality of memory blocks based at least in part on the performed error detection.

17. The memory device according to claim 1 wherein:
the non-volatile memory array includes a plurality of memory blocks including one or more layers of discrete storage cells extending laterally across the memory integrated circuit chip; and
the control logic operable to selectively distribute information processing functionality across the non-volatile memory array is operable to monitor writes to the plurality of memory blocks of the non-volatile memory array and allocate writes to the memory blocks based at least in part on results of the monitoring.

18. The memory device according to claim 1 wherein:
the non-volatile memory array includes a plurality of memory blocks including one or more layers of discrete storage cells extending laterally across the memory integrated circuit chip; and
the control logic operable to selectively distribute information processing functionality across the non-volatile memory array is operable to monitor operating characteristics of the memory device, analyze the monitored operating characteristics, detect a precursor to a memory failure based on the analysis, and allocate memory accesses among the plurality of memory blocks based at least in part on the detected precursor.

19. The memory device according to claim 1 wherein:
the non-volatile memory array includes a plurality of memory blocks including one or more layers of discrete storage cells extending laterally across the memory integrated circuit chip; and
the control logic operable to selectively distribute information processing functionality across the non-volatile memory array is operable to receive a report on an operating condition of system performance for a system including the memory device at system bootstrap loading and allocate information processing functionality among the plurality of memory blocks based at least in part on the report.

20. The memory device according to claim 1 wherein:
at least one sensor operable to detect an operating condition of a system including the memory device, wherein:
the non-volatile memory array includes a plurality of memory blocks including one or more layers of discrete storage cells extending laterally across the memory integrated circuit chip; and
the control logic operable to selectively distribute information processing functionality across the non-volatile memory array is operable to monitor the operating condition, analyze the monitored operating condition, detect a precursor to a memory failure based on the analysis, and allocate memory accesses among the plurality of memory blocks based at least in part on the detected precursor.

21. The memory device according to claim 1 wherein:
at least one sensor operable to detect an operating condition of a system including the memory device, wherein:
the control logic operable to selectively distribute information processing functionality across the non-volatile memory array is operable to monitor the operating condition, monitor memory accesses, analyze the monitored operating conditions and memory accesses, predict expected outcomes based at least in part on the monitored operating conditions and memory accesses, and allocate memory accesses based on the predicted expected outcomes.

22. The memory device according to claim 1 wherein:
at least one sensor operable to detect an operating condition of a system including the memory device, wherein:
the non-volatile memory array includes a plurality of memory blocks including one or more layers of discrete storage cells extending laterally across the memory integrated circuit chip; and
the control logic operable to selectively distribute information processing functionality across the non-volatile memory array is operable to monitor the operating condition, monitor memory accesses, analyze the monitored operating conditions and memory accesses, predict expected outcomes based at least in part on the monitored operating conditions and memory accesses, and allocate memory accesses to the plurality of memory blocks based at least in part on the predicted expected outcomes.

23. The memory device according to claim 1 wherein:
the non-volatile memory array includes a plurality of memory blocks characterized by a plurality of different operating characteristics, the plurality of memory blocks including one or more layers of discrete storage cells extending laterally across the memory integrated circuit chip; and
the control logic operable to selectively distribute information processing functionality across the non-volatile memory array is operable to perform a plurality of error correction algorithms and selectively allocate one or more of the plurality of error correction algorithms to one or more of the plurality of memory blocks.

24. The memory device according to claim 1 wherein:
the non-volatile memory array includes a plurality of memory blocks including one or more layers of discrete storage cells extending laterally across the memory integrated circuit chip; and
the control logic operable to selectively distribute information processing functionality across the non-volatile memory array is operable to access a time signal and monitor memory accesses referenced by the time signal, analyze workload based at least in part on the monitored memory accesses, and allocate memory accesses among the plurality of memory blocks based at least in part on the analyzed workload.

25. The memory device according to claim 1 wherein:
the non-volatile memory array includes a plurality of memory blocks including at least one memory block including lossy memory, the plurality of memory blocks including one or more layers of discrete storage cells extending laterally across the memory integrated circuit chip; and
the control logic operable to selectively distribute information processing functionality across the non-volatile memory array is operable to monitor memory accesses, analyze the memory accesses to determine instructions and data indicative for storage in the at least one memory block including lossy memory, and selectively allocate memory accesses to the at least one memory block including lossy memory.

26. The memory device according to claim 1 wherein:
the non-volatile memory array includes a plurality of memory blocks including one or more layers of discrete storage cells extending laterally across the memory integrated circuit chip; and
the control logic operable to selectively distribute information processing functionality across the non-volatile memory array is operable to selectively access one or more of the plurality of memory blocks as bit-mapped memory and access one or more of the plurality of memory blocks as vector memory.

27. The memory device according to claim 1 further comprising:
a communication interface coupled to the non-volatile memory array and the control logic, the communication interface operable to communicate external to the memory device.

28. The memory device according to claim 1 further comprising:
optical silicon integrated with the control logic and the non-volatile memory array on the memory integrated circuit chip and operable to communicate optically, independently of a bus coupled to the memory device wherein the control logic is operable to receive functions for tracking applications and processes independently of communication via the bus.

29. The memory device according to claim 1 wherein:
the control logic operable to selectively distribute information processing functionality across the non-volatile memory array is operable to monitor memory accesses and perform pattern recognition of the monitored memory accesses operable in combination with the non-volatile memory array to accumulate information about a product.

30. A memory system comprising:
means for storing information in a memory device including a non-volatile memory array including one or more layers of discrete storage cells extending laterally across a memory integrated circuit chip;
means for controlling the means for storing information, the means for controlling integrated with and distributed over the non-volatile memory array in combination with the one or more layers of discrete storage cells and distributed extending laterally over the non-volatile memory array; and
means for selectively distributing information processing functionality across the non-volatile memory array.

31. A system comprising:
circuitry for storing information in a memory device including a non-volatile memory array including one or more layers of discrete storage cells extending laterally across a memory integrated circuit chip;
circuitry for controlling the means for storing information, the circuitry for controlling integrated with and distributed over the non-volatile memory array in combination with the one or more layers of discrete storage cells and distributed extending laterally over the non-volatile memory array; and
circuitry for selectively distributing information processing functionality across the non-volatile memory array.

* * * * *